United States Patent
Gogoi

(10) Patent No.: US 9,406,750 B2
(45) Date of Patent: Aug. 2, 2016

(54) OUTPUT CAPACITANCE REDUCTION IN POWER TRANSISTORS

(71) Applicant: Empire Technology Development LLC, Wilmington, DE (US)

(72) Inventor: Bishnu Prasanna Gogoi, Scottsdale, AZ (US)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 0 days.

(21) Appl. No.: 14/548,264

(22) Filed: Nov. 19, 2014

(65) Prior Publication Data

US 2016/0141362 A1 May 19, 2016

(51) Int. Cl.
| | | |
|---|---|---|
| H01L 29/78 | (2006.01) | |
| H01L 29/06 | (2006.01) | |
| H01L 29/423 | (2006.01) | |
| H01L 29/08 | (2006.01) | |
| H01L 29/40 | (2006.01) | |

(52) U.S. Cl.
CPC ........ *H01L 29/0688* (2013.01); *H01L 29/0649* (2013.01); *H01L 29/0657* (2013.01); *H01L 29/0882* (2013.01); *H01L 29/0886* (2013.01); *H01L 29/407* (2013.01); *H01L 29/42356* (2013.01); *H01L 29/7802* (2013.01); *H01L 29/7816* (2013.01)

(58) Field of Classification Search
CPC ............ H01L 29/0688; H01L 29/0657; H01L 29/0649; H01L 29/42356; H01L 29/0886; H01L 29/0882; H01L 29/7802; H01L 29/7816; H01L 29/407
See application file for complete search history.

(56) References Cited

U.S. PATENT DOCUMENTS 5,686,755 A 11/1997 Malhi
5,912,490 A 6/1999 Hebert et al.
(Continued)

FOREIGN PATENT DOCUMENTS

| EP | 1096573 A2 | 5/2001 |
|---|---|---|
| JP | S6119177 A | 1/1986 |
| WO | 2005083775 A1 | 9/2005 |

OTHER PUBLICATIONS

Burger, W. et al., "RF-LDMOS: a device technology for high power RF infrastructure applications," Compound Semiconductor Integrated Circuit Symposium, IEEE, pp. 189-192 (2004).
(Continued)

*Primary Examiner* — Long Pham
(74) *Attorney, Agent, or Firm* — Turk IP Law, LLC

(57) ABSTRACT

Technologies are described for reduction of an output capacitance of a transistor. In some examples, spacing of source-to-drain metallization may be increased and a sealed air-gap may be employed in an elongated trench in the drain region to reduce a dielectric constant of a portion of the body region and thereby the output capacitance of the transistor. In other examples, a planar area component of a body-drain junction may be reduced by forming a spherical cavity at a bottom portion of the body-drain junction and sealing the cavity with a low dielectric constant material. In further examples, a sealed cavity may be formed in an epitaxial region below the body region through formation and removal of selective buried oxide islands. In yet other examples, the output capacitance may be reduced through removal of areas in the drain region of the transistor that do not contribute to the current flow.

13 Claims, 14 Drawing Sheets

(56) References Cited

U.S. PATENT DOCUMENTS

| | | |
|---|---|---|
| 6,194,760 B1 | 2/2001 | Lee |
| 6,255,695 B1 | 7/2001 | Kubota et al. |
| 6,271,552 B1 | 8/2001 | D'Anna |
| 6,713,814 B1 | 3/2004 | Koscielniak |
| 6,750,105 B2 | 6/2004 | Disney |
| 6,777,293 B1 | 8/2004 | Koscielniak |
| 7,019,365 B2 | 3/2006 | Sato et al. |
| 7,233,044 B2 | 6/2007 | Dudek |
| 7,276,747 B2 | 10/2007 | Loechelt et al. |
| 7,420,249 B2 | 9/2008 | Sato et al. |
| 7,585,743 B2 | 9/2009 | Renna et al. |
| 7,732,286 B2 | 6/2010 | Hanafi et al. |
| 7,847,350 B2 | 12/2010 | Davies |
| 7,847,369 B2 | 12/2010 | Davies |
| 8,067,834 B2 | 11/2011 | Moline |
| 8,097,910 B2 | 1/2012 | Juengling |
| 8,213,226 B2 | 7/2012 | Carman |
| 8,362,536 B2 | 1/2013 | Chung et al. |
| 2001/0026989 A1 | 10/2001 | Thapar |
| 2006/0091453 A1 | 5/2006 | Matsuda et al. |
| 2007/0224763 A1 | 9/2007 | Fujimoto et al. |
| 2009/0008709 A1 | 1/2009 | Yedinak et al. |
| 2009/0057711 A1 | 3/2009 | Chen |
| 2010/0200914 A1 | 8/2010 | Hamada |
| 2011/0298040 A1 | 12/2011 | Kim |
| 2012/0018800 A1* | 1/2012 | Kim ............... H01L 29/0634 257/330 |
| 2012/0086045 A1 | 4/2012 | Molin et al. |
| 2012/0086051 A1 | 4/2012 | Wang et al. |
| 2012/0094454 A1 | 4/2012 | Cho et al. |
| 2012/0161226 A1 | 6/2012 | Darwish |
| 2012/0248528 A1 | 10/2012 | Wilson et al. |
| 2013/0221433 A1 | 8/2013 | Molin et al. |

OTHER PUBLICATIONS

Cai, W. et al., "TCAD analysis of a vertical RF power transistor," SISPAD '09. International Conference on Simulation of Semiconductor Processes and Devices, pp. 249-252 (2009).

Gogoi, B. et al., "New vertical silicon microwave power transistor structure and package with inherent thermal self protection," IEEE MTT-s International Microwave Symposium, Boston, Massachusetts, pp. 569-572 (Jun. 7-12, 2009).

Lorenz, L. et al., "A new milestone in high voltage power MOS," Proc. 11th Intl. Symp. Power Semiconductor Devices and ICs (ISPSD), pp. 3-10 (May 26-28, 1999).

International Search Report for International Application No. PCT/US14/32586 mailed Aug. 21, 2014.

Wayne, B., et al., "RF-LDMOS: A device technology for high power RF infrastructure applications," IEEE Compound Semiconductor Integrated Circuit Symposium, pp. 189-192 (Oct. 24-27, 2004).

\* cited by examiner

OUTPUT CAPACITANCE REDUCTION IN POWER TRANSISTORS

BACKGROUND

Unless otherwise indicated herein, the materials described in this section are not prior art to the claims in this application and are not admitted to be prior art by inclusion in this section.

Reduction of power transistor input, output, and feedback capacitances may result in operating frequency and bandwidth increases and transition time reductions for these semiconductor devices. A relatively large power transistor output capacitance may limit high speed operation and may lower device efficiencies. The output capacitance may be due to the coupling of the source and the drain terminals of the transistor through a thin dielectric in the body region or a junction of the source/body and drain region. In some applications, the body region and the source region of the transistor may be electrically coupled using a metallized contact. As a result, the body junction may form a depletion capacitance with the drain region thereby contributing to the output capacitance. The output capacitance may have a planar area component at a bottom portion of the body region and a vertical component in the sidewalls of the body region.

SUMMARY

The present disclosure is generally directed to power transistors with reduced output capacitance and methods to fabricate such devices.

According to some examples, semiconductor devices are described. An example semiconductor device may include a substrate, an epitaxial layer in contact with a surface of the substrate, a nitride layer in contact with a surface of the epitaxial layer, a body region within a top portion of the epitaxial layer, a source region within the top portion of the epitaxial layer, and a drain region within the epitaxial layer. The source region may be electrically coupled to the body region, and the epitaxial layer may include a cavity region below the nitride layer between the drain region and the body region such that a planar drift distance between the drain region and the source region is increased by two or more dimensions of the cavity region.

According to other examples, methods to fabricate a semiconductor device are described. An example method may include forming an epitaxial region over a substrate, forming two drain regions within the epitaxial layer, forming a body region within a top portion of the epitaxial layer between the two drain regions, and forming a source region within the top portion of the epitaxial layer, where the source region is electrically coupled to the body region. The method may further include forming a nitride layer in contact with a top surface of the epitaxial layer and forming two cavity regions located substantially between the body region and the two drain regions below the nitride layer such that a planar drift distance between the two drain regions and the source region is increased by two or more dimensions of the cavity region.

According to further examples, semiconductor devices are described. An example semiconductor device may include a substrate, an epitaxial layer in contact with a top surface of the substrate, a drain layer in the substrate, a body region within a top portion of the epitaxial layer, and a source region within a top portion of the body region. The semiconductor device may further include a vertical gate structure substantially along at least one outer edge of the body region and a substantially spherical cavity region within the epitaxial layer and a bottom portion of the body region. The cavity region may be configured to lower a contribution of the body region to an output capacitance of the semiconductor device with a reduced effect on a current flow through the body region.

According to yet further examples, methods to fabricate a semiconductor device are described. An example method may include forming an epitaxial region on a top surface of a substrate, forming a drain layer in the substrate, forming a body region within a top portion of the epitaxial layer, and forming a vertical gate structure substantially along at least one outer edge of the body region. The method may further include forming a source region within a top portion of the body region and forming a substantially spherical cavity region within the epitaxial layer and a bottom portion of the body region. The cavity region may be configured to lower a contribution of the body region to an output capacitance of the semiconductor device with a reduced effect on a current flow through the body region.

According to some examples, semiconductor devices are described. An example semiconductor device may include a substrate, an epitaxial layer in contact with a top surface of the substrate, a drain layer in the substrate, a body region within a top portion of the epitaxial layer, and a source region within a top portion of the body region. The semiconductor device may further include a vertical gate structure substantially along at least one outer edge of the body region and a substantially T-shaped cavity region within the epitaxial layer and a bottom portion of the body region. The cavity region may be configured to lower a contribution of the body region to an output capacitance of the semiconductor device with a reduced effect on a current flow through the body region.

According to other examples, methods to fabricate a semiconductor device are described. An example method may include forming an epitaxial region on a top surface of a substrate, forming a drain layer in the substrate, forming a body region within a top portion of the epitaxial layer, and forming a vertical gate structure substantially along at least one outer edge of the body region. The method may further include forming a source region within a top portion of the body region and forming a substantially T-shaped cavity region within the epitaxial layer and a bottom portion of the body region. The cavity region may be configured to lower a contribution of the body region to an output capacitance of the semiconductor device with a reduced effect on a current flow through the body region.

According to further examples, semiconductor devices are described. An example semiconductor device may include a substrate, an epitaxial layer in contact with a top surface of the substrate, a drain layer in the substrate, a body region within a top portion of the epitaxial layer, and a source region within a top portion of the body region. The semiconductor device may further include a vertical gate structure substantially along at least one outer edge of the body region and two trenches on opposite sides of the body region in the top portion of the epitaxial layer. The trenches may be filled with a dielectric material, and corners of at least one of the two trenches may be rounded to lower a contribution of the body region to an output capacitance of the semiconductor device with a reduced effect on a current flow through the body region.

According to yet further examples, methods to fabricate a semiconductor device are described. An example method may include forming an epitaxial region on a top surface of a substrate, forming a drain layer in the substrate, forming a body region within a top portion of the epitaxial layer, and forming a vertical gate structure substantially along at least one outer edge of the body region. The method may further include forming a source region within a top portion of the body region and forming two trenches on opposite sides of the body region in the top portion of the epitaxial layer. The method may further include filling the trenches with a dielectric material and rounding corners of at least one of the two trenches to lower a contribution of the body region to an output capacitance of the semiconductor device with a reduced effect on a current flow through the body region.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
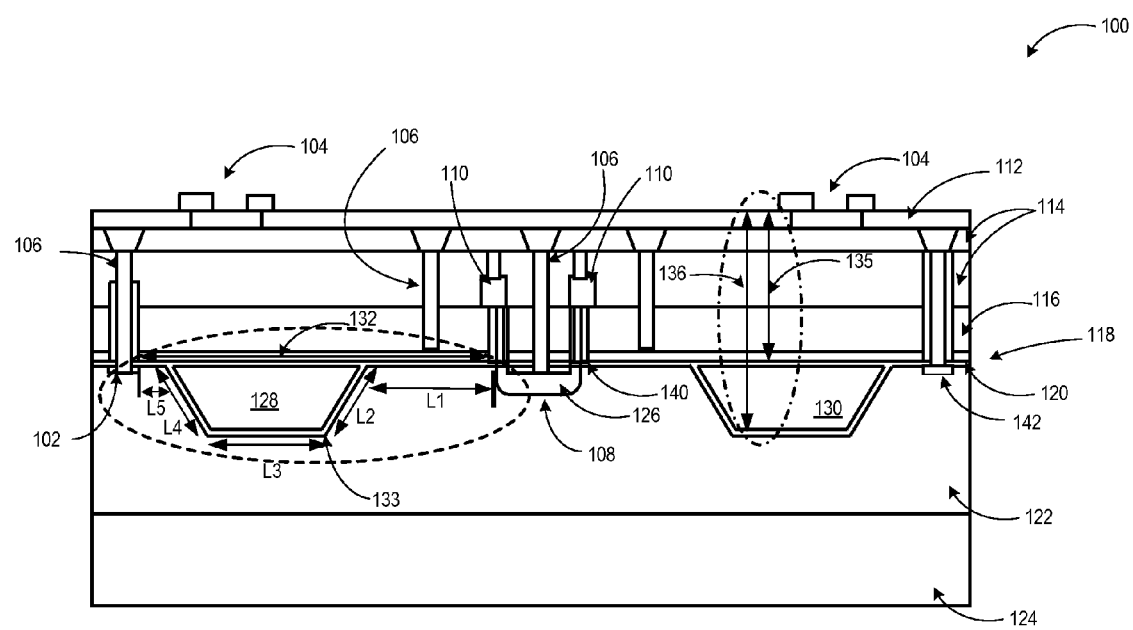
FIG. 1 illustrates a side view of an example transistor with reduced output capacitance through increased spacing between source-to-drain metallization and/or a sealed air gap in an elongated trench.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to apparatus, devices, and/or methods related to transistors with reduced output capacitance.

Briefly stated, technologies are described for reduction of an output capacitance of a transistor. In some examples, spacing of source-to-drain metallization may be increased and a sealed air-gap may be employed in an elongated trench in the drain region to reduce a dielectric constant of a portion of the body region and thereby the output capacitance of the transistor. In other examples, a planar area component of a body-drain junction may be reduced by forming a spherical cavity at a bottom portion of the body-drain junction and sealing the cavity with a low dielectric constant material. In further examples, a sealed cavity may be formed in an epitaxial region below the body region through formation and removal of selective buried oxide islands. In yet other examples, the output capacitance may be reduced through removal of areas in the drain region of the transistor that do not contribute to the current flow.

FIG. 1 illustrates a side view of an example transistor with reduced output capacitance through increased spacing between source-to-drain metallization and/or a sealed air gap in an elongated trench, arranged in accordance with at least some embodiments described herein.

According to FIG. 1, a transistor 100 may be fabricated on a substrate having an epitaxial silicon layer 122 on and in contact with a surface of a heavily doped silicon substrate 124. The transistor 100 may include a nitride layer 120 and a pedestal layer 118 formed of a dielectric (for example, tetraethyl orthosilicate or TEOS) disposed on, and in contact with a surface of the nitride layer 120. The transistor 100 may also include a planarizing dielectric layer 116 disposed on and in contact with a surface of the pedestal layer 118 and one or more interlayer dielectric layers 114 disposed on and in contact with a surface of the planarizing dielectric layer 116. In some embodiments, the transistor 100 may also include one or more conductive plug contacts 106 that electrically couple a metal layer 112 to a source region 108, a drain region 102, and another drain region 142 of the transistor 100. In some embodiments, the plug contacts 106 may be formed of tungsten, although in other embodiments the plug contacts 106 may be formed of any suitable conductive material. Different portions of the metal layer 112 may be separated by passivation portions 104. The transistor 100 may also include at least two vertical or sidewall gates 110 capacitively coupled to a body implant region 126. The vertical gates 110 may include gate terminals disposed on the top surface of the epitaxial silicon layer 122 and substantially along at least one outer edge of the body implant region 126. The body implant region 126 may be formed by implanting boron or any other suitable impurity in the epitaxial silicon layer 122. The body implant region 126 may be centrally disposed in a top portion of the epitaxial silicon layer 122 between the drain region 102 and the other drain region 142, and be electrically coupled to the source region 108, the drain region 102, and/or the drain region 142. A shield layer 140 separating the nitride layer 120 from the epitaxial silicon layer 122 may reduce the coupling of the vertical gate 110 to the drain region 102. In some embodiments, the transistor 100 may be configured as a lateral transistor, a lateral power transistor, a lateral radio frequency (RF) power transistor, a lateral double-diffused metal oxide semiconductor (LDMOS) device, or some other type of device/transistor.

In some embodiments, the transistor 100 may have an output capacitance and a drift length or distance. The output capacitance may be directly related to the spacing between a metallic source contact (for example, the portion of the metal layer 112 coupled to the source region 108) and the drain region 102, and the drift length may be directly related to the spacing between the source region 108 and the drain region 102. As described above, reducing transistor output capacitances may improve transistor operating parameters such as operating frequencies, bandwidths, transition times, or other parameters. Accordingly, it may be useful to reduce transistor output capacitances. In addition, while specific drift lengths may be involved in providing a sufficient high breakdown voltage for transistor operation, it may be useful to be able to achieve a particular drift length with a horizontal distance less than the drift length. For example, reduction of horizontal spacing may result in increased device density on a semiconductor wafer or reduction of die size for a power transistor with a specific power rating.

Accordingly, in some embodiments, the transistor 100 may include cavity regions 128 and 130 configured to reduce transistor output capacitance and horizontal spacing (also known as pitch). The cavity regions 128 and 130 may be disposed within the epitaxial silicon layer 122, beneath the nitride layer 120, and between the source region 108 and the drain region 102 (and the corresponding drain region 142 on the other side of the source region 108). The cavity regions 128 and 130 may have substantially trapezoidal cross-sections as depicted in FIG. 1, and may be filled with vacuum, atmosphere, or any other suitable gas or medium. In some embodiments, the widths of the cavity regions 128 and 130 may be in a range from about 3 micrometers to about 20 micrometers for example, and the heights of the cavity regions may be in a range from about 0.5 micrometers to about 5 micrometers for example. Other dimensions are possible in other embodiments.

The cavity regions 128 and 130 may decrease an output capacitance of the transistor 100 by providing additional vertical distance between a metallic source contact of the transistor 100 and a drain region of the transistor 100. In a transistor without the cavity region 130, the transistor output capacitance may be governed by a distance 135 between the metallic source contact portion of the metal layer 112 and the epitaxial silicon layer 122. The addition of the cavity region 130 may increase the vertical separation between the metal layer 112 and the top of the epitaxial silicon layer 122, which may result in an increased distance 136 and a corresponding decrease in output capacitance. In addition, the vacuum or gas filling the cavity 130 may reduce the dielectric constant between the metal layer 112 and the top of the epitaxial silicon layer 122, which may result in a further decrease in output capacitance.

The cavity regions 128 and 130 may also increase an effective drift length of the transistor 100 by two or more dimensions. For example, in the absence of the cavity region 128, the drift length may correspond to distance 132 between the source region 108 and the drain region 102. In the presence of the cavity region 128, carriers may not be able to drift between the source region 108 and the drain region 102 in a straight line (that is, along the distance 132), and may instead be forced to traverse a path 133 around the cavity region 128 and including segments L1, L2, L3, L4, and L5. The distance of the path 133 may be longer than the distance 132 due to the addition of the vertical components of segments L2 and L4. Accordingly, a given drift length (for example, the distance of the path 133) may be implemented for a smaller horizontal separation (for example, the distance 132) or for the same horizontal separation distance support a higher breakdown voltage. The cavity regions 128 and 130 may enable the increase in the drift length without a corresponding increase in the output capacitance contribution from the drift region.

Figure 2:
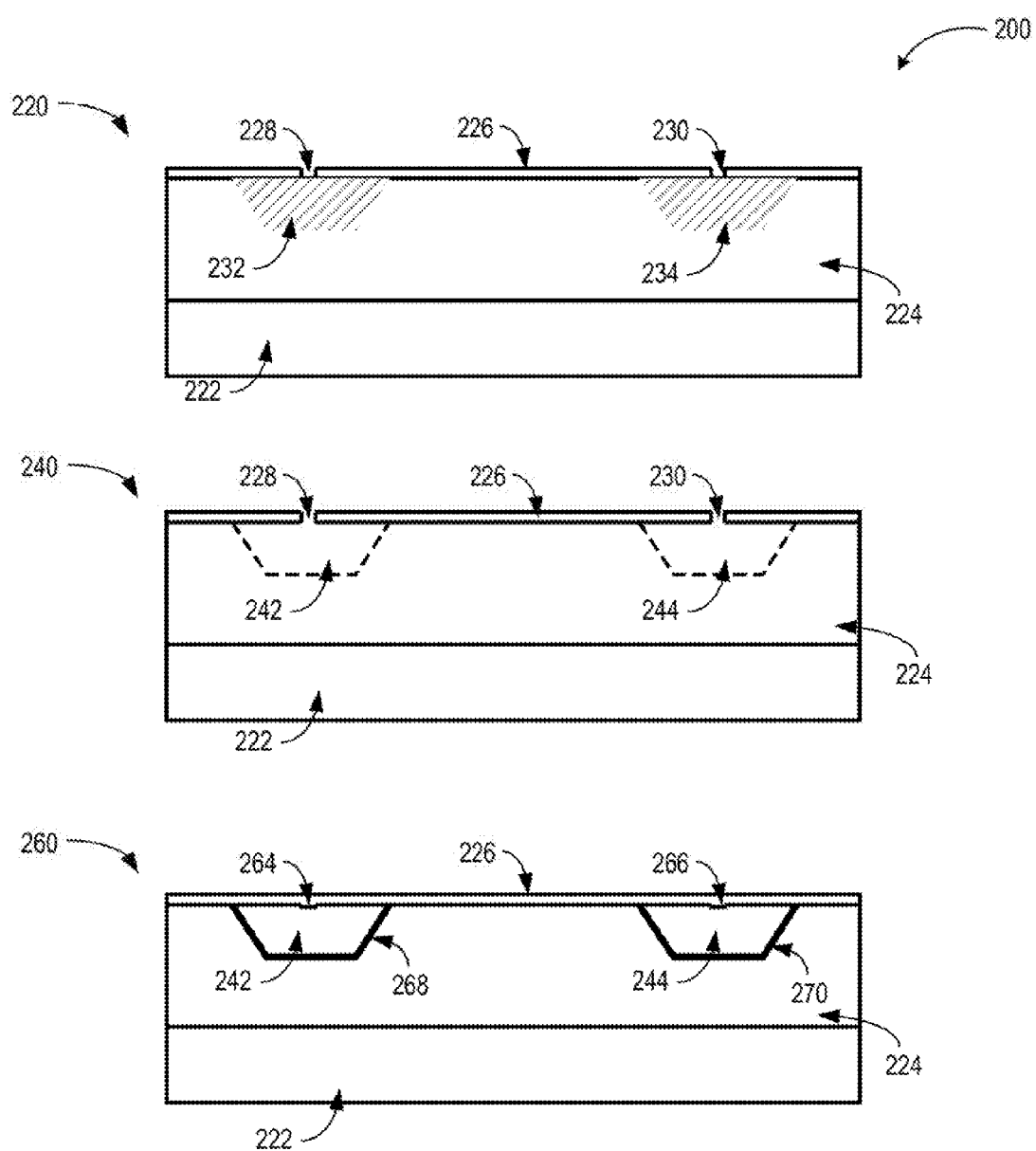
FIG. 2 depicts an example process by which sealed air gaps may be formed in a semiconductor device.

FIG. 2 depicts an example process 200 by which sealed air gaps may be formed in a semiconductor device, arranged in accordance with at least some embodiments described herein.

The process 200 illustrates how sealed cavity regions, such as the sealed cavity regions 128 and 130, may be formed. A diagram 220 depicts a portion of a transistor (for example, the transistor 100) during fabrication. The transistor portion may include an epitaxial layer 224 (similar to the epitaxial silicon layer 122) disposed on a heavily doped substrate 222 (similar to the heavily doped silicon substrate 124). Two regions 232 and 234 may have been previously etched (for example, using tetramethylammonium hydroxide or TMAH in an anisotropic etch process) and then refilled with a dielectric (for example, silicon oxide). The surface may then have been planarized, a masking nitride layer 226 deposited on the planarized surface, and then openings 228 and 230 etched in the nitride layer 226 to expose the dielectric in the regions 232 and 234.

The dielectric in the regions 232 and 234 may then be etched through the openings 228 and 238 to form cavity regions 242 and 244, as depicted in diagram 240. If the refill material in the regions 232 and 234 is an oxide, the refill material may be removed using a hydrofluoric acid etch solution or gas. The exposed surfaces of the cavity regions 242 and 244 may then be sealed with nitride layers 268 and 270, for example using a low-pressure chemical vapor deposition (LPCVD) process, as depicted in diagram 260. The same LPCVD process may also seal openings 228 and 230 with nitride plugs 264 and 266.

Figure 3:
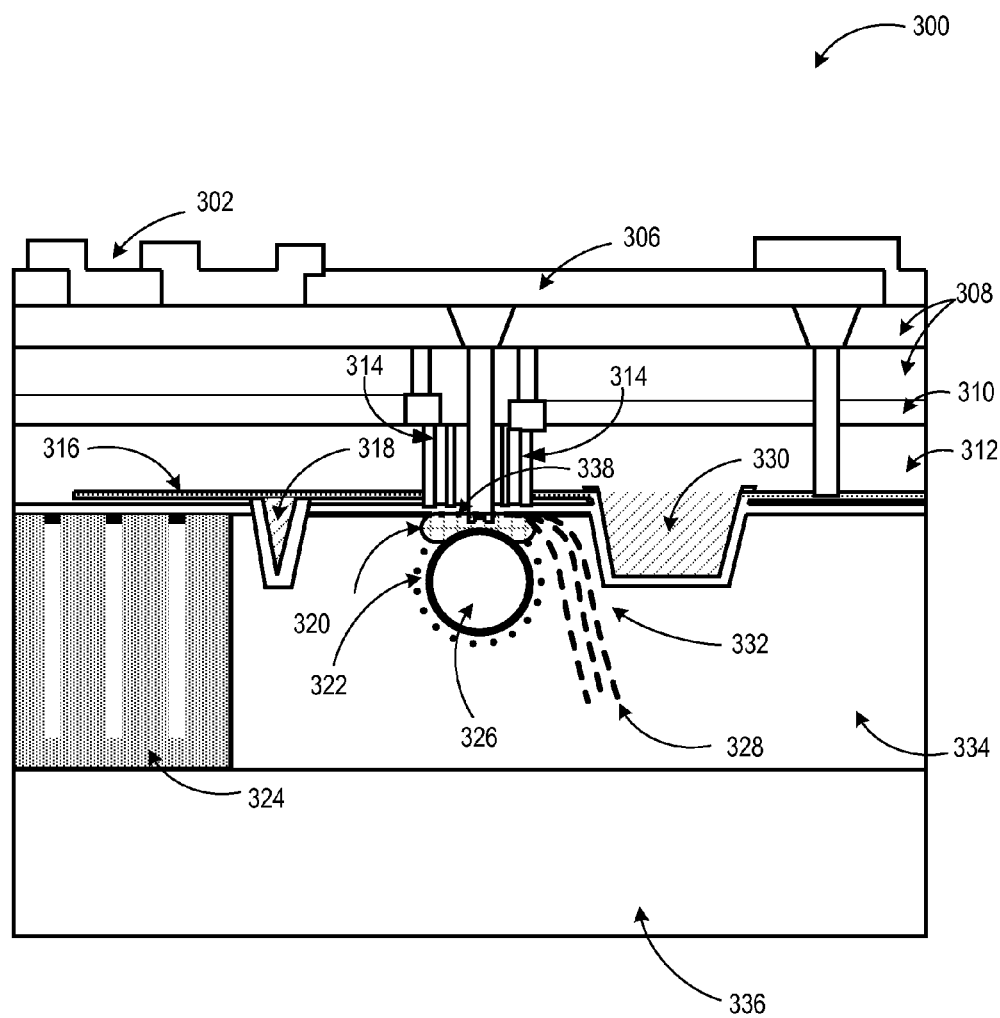
FIG. 3 illustrates a side view of an example transistor with reduced output capacitance through a sealed spherical cavity underneath a body region.

FIG. 3 illustrates a side view of an example transistor with reduced output capacitance through a sealed spherical cavity underneath a body region, arranged in accordance with at least some embodiments described herein.

According to FIG. 3, a transistor 300, which may be configured as a vertical transistor, a vertical gate shielded power transistor, a lateral transistor, a lateral gate shielded power transistor, or other type of transistor may be fabricated on a substrate having an epitaxial layer 334, for example, made of a silicon material, on a heavily doped silicon substrate 336. The transistor 300 may have a shield layer 316 covering at least a portion of the top surface of the epitaxial silicon layer 334 and a pedestal layer 312 formed of a dielectric (for example, tetraethyl orthosilicate or TEOS) and disposed on the shield layer 316. The transistor 300 may also have a planarizing dielectric layer 310 disposed on the pedestal layer 312 and one or more interlayer dielectric layers 308 disposed on the planarizing dielectric layer 310. The transistor 300 may also include a source contact 306 and a gate contact 302 formed of a metallic layer disposed on the interlayer dielectric layers 308. The source contact 306 may be configured to electrically couple to a body implant region 320, which may be formed by implanting boron or any other suitable impurity into the epitaxial layer 334. In some embodiments, the source contact 306 may couple to the body implant region 320 through a source region 338 at the top of the body implant region 320. In some embodiments, the source contact 306 may also electrically couple to the shield layer 316.

The body implant region 320 may in turn electrically couple to the epitaxial layer 334, which may in turn electrically couple to the heavily doped silicon substrate 336. The gate contact 302 may be configured to electrically couple to a vertical (or sidewall) gate structure 314. The vertical gate structure 314 may be disposed along at least one outer edge of the body implant region 320, may include at least two separate gate terminals, and may be configured to control current flow through the body implant region 320. In some embodiments, the vertical gate structure 314 may be configured to control current flow from the source contact 306 through the body implant region 320 to the heavily doped silicon substrate 336, which together with the epitaxial layer 334 may serve as the transistor drain. In some embodiments, the shield layer 316 may be configured to reduce coupling between the vertical structure gate 314 and the transistor drain, represented by the epitaxial layer 334. The transistor 300 may further include drain trench structures 318 and 330 in the top portion of the epitaxial layer 334 and disposed on opposite sides of the body implant region 320. The drain trench structures 318 and 330 may have conductive shield layers (similar to the shield layer 316) deposited on their sidewalls, and may also include trench structure 324 for device isolation. The shield layer extension provided by the drain trench structures 318 and 330 and their sidewall shield layers may improve the breakdown characteristics of the transistor 300 by depleting the drain region.

As described above, a transistor such as the transistor 300 may have an output capacitance associated with the coupling between the transistor source, represented by the source contact 306, and the transistor drain, represented by the epitaxial layer 334. In some embodiments, coupling between the bottom of the body implant region 320 and the epitaxial layer 334 may contribute significantly to the output capacitance of the transistor 300. Reduction of the area of the interface between the bottom of the body implant region 320 and the epitaxial layer 334 may reduce the output capacitance of the transistor 300.

In some embodiments, the interface area between the body implant region 320 and the epitaxial layer 334 may be reduced by the introduction of a cavity beneath the body implant region 320. Accordingly, transistor 300 may include a substantially or generally spherical cavity 326 disposed beneath and overlapping at least a portion of the bottom surface of the body implant region 320. The spherical cavity 326 may replace a substantial portion of what would otherwise be interface area between the body implant region 320 and the epitaxial layer 334 with an interface area 322 between the body implant region 320 and the spherical cavity 326 itself, which may not contribute significantly to the output capacitance of the transistor 300. Moreover, the spherical cavity 326 may be disposed and configured such that a current flow 328 between the body implant region 320 and the epitaxial layer 334 is not adversely affected. For example, the spherical cavity 326 may be positioned and sized such that sufficient area 332 for the current flow 328 exists.

Figure 4:
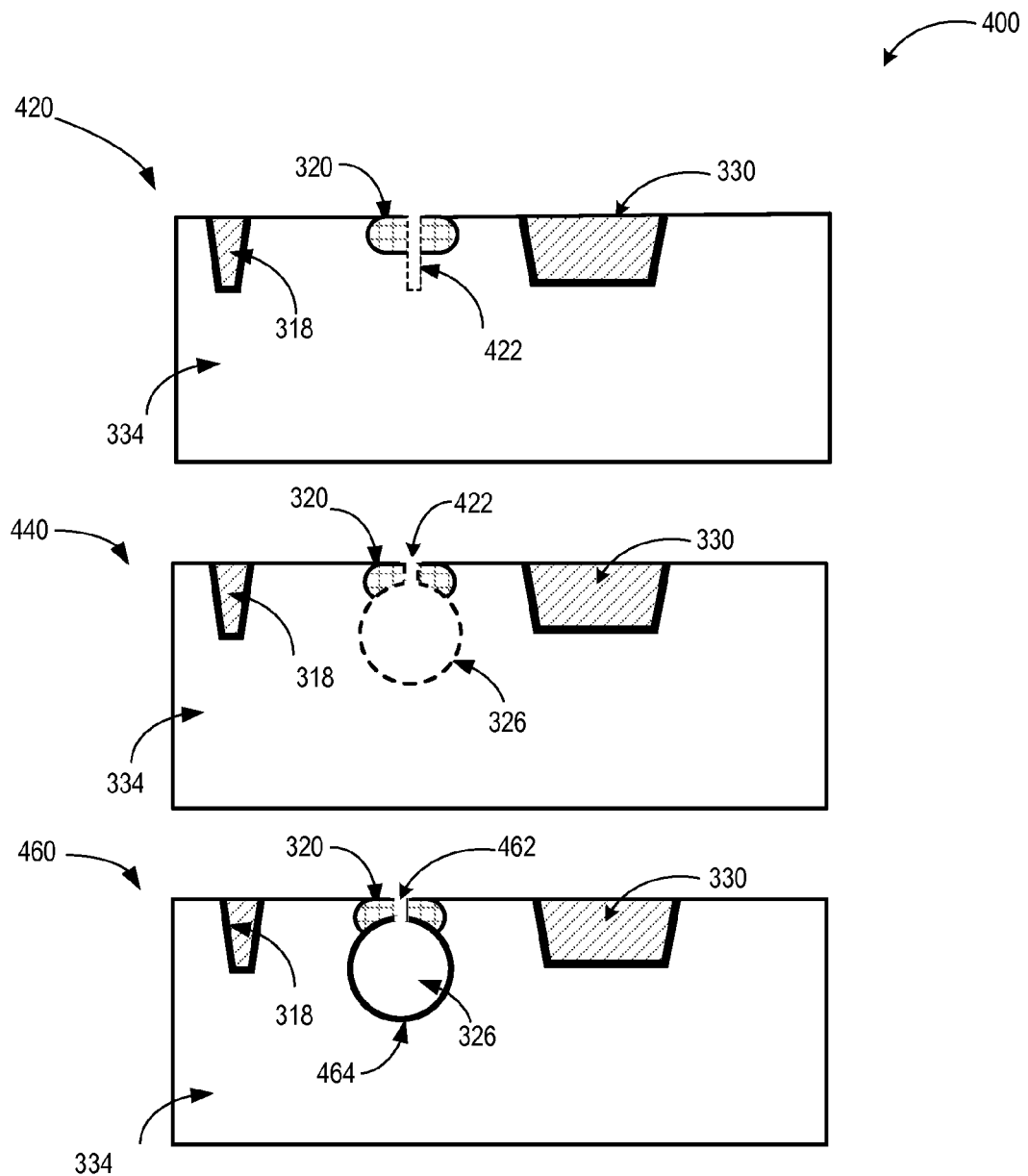
FIG. 4 depicts an example process by which sealed spherical cavities may be formed in a semiconductor device.

FIG. 4 depicts an example process 400 by which sealed spherical cavities may be formed in a semiconductor device, arranged in accordance with at least some embodiments described herein.

The process 400 illustrates how sealed spherical cavities, such as the spherical cavity 326, may be formed. A diagram 420 depicts a portion of a transistor (for example, the transistor 300) during fabrication. The depicted transistor portion may include the epitaxial layer 334, the drain trench structures 318 and 330, and the body implant region 320. A narrow trench 422 may be etched or otherwise formed in approximately the middle of the body implant region 320, for example using a deep reactive ion etch (DRIE) process. In some embodiments, the trench 422 may have a diameter or width of about 0.25 to 0.5 micrometers, and may have a depth of about 2 micrometers to 8 micrometers. The walls of the trench 422 may be protected by a thin layer of polymer or other dielectric, which may be deposited as part of the DRIE process or in another process.

Subsequently, an isotropic silicon etch may be performed at the bottom of the trench 422 to remove a central portion of the body implant region 320, at least a portion of the source region 338, a bottom portion of the body implant region 320, and/or a portion of the epitaxial layer 334 below the body implant region 320. In some embodiments, an etching process that is highly selective for silicon may be used, such as an XeF2 (xenon difluoride) etching process. The isotropic nature of the etch process may mean that the etch process has no directional preference, and therefore may result in the formation of a spherical cavity such as the spherical cavity 326, as depicted in diagram 440. The position and dimensions of the spherical cavity 326 may be selected to overlap a substantial portion of the interface area between the body implant region 320 and the epitaxial layer 334 so as to reduce the overall output capacitance of the transistor, as described above. The surface of the spherical cavity 326 as well as the narrow trench 422 may then sealed by a layer of dielectric 464 and a dielectric plug 462, respectively. In some embodiments the sealing process may include an LPCVD oxide deposition process, as described previously.

Figure 5:
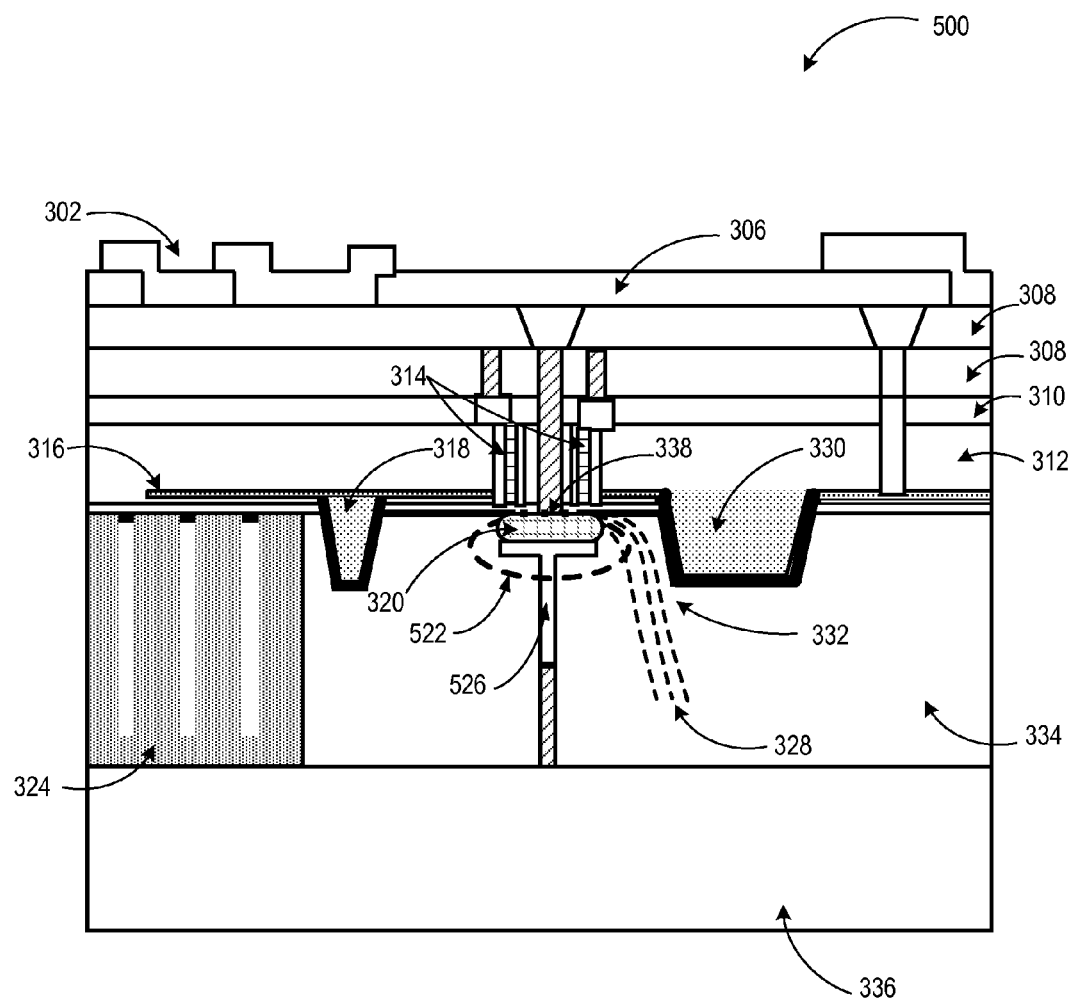
FIG. 5 illustrates a side view of an example transistor with reduced output capacitance through removal of a planar area component of a body-drain junction region.

FIG. 5 illustrates a side view of an example transistor with reduced output capacitance through removal of a planar area component of a body-drain junction region, arranged in accordance with at least some embodiments described herein.

According to FIG. 5, a transistor 500 may be similar to the transistor 300, with similarly-numbered elements having generally similar characteristics. Different from the transistor 300, the transistor 500 may include a cavity 526 with a substantially T-shaped cross-section disposed beneath and overlapping at least a portion of the bottom surface of the body implant region 320. As with the spherical cavity 326, the T-shaped cavity 526 may replace a substantial portion of what would otherwise be interface area between the body implant region 320 and the epitaxial layer 334 with an interface area 522 between the body implant region 320 and the T-shaped cavity 526 itself, which may not contribute significantly to the output capacitance of the transistor 500. The T-shaped cavity may also be disposed and configured such that the current flow 328 between the body implant region 320 and the epitaxial silicon layer 334 is not adversely affected. For example, the T-shaped cavity 526 may be positioned and sized such that sufficient area 332 for the current flow 328 exists. In some embodiments, the top of the T-shaped cavity 526 may have a width that is substantially equal to the width of the body implant region 320.

Figure 6:
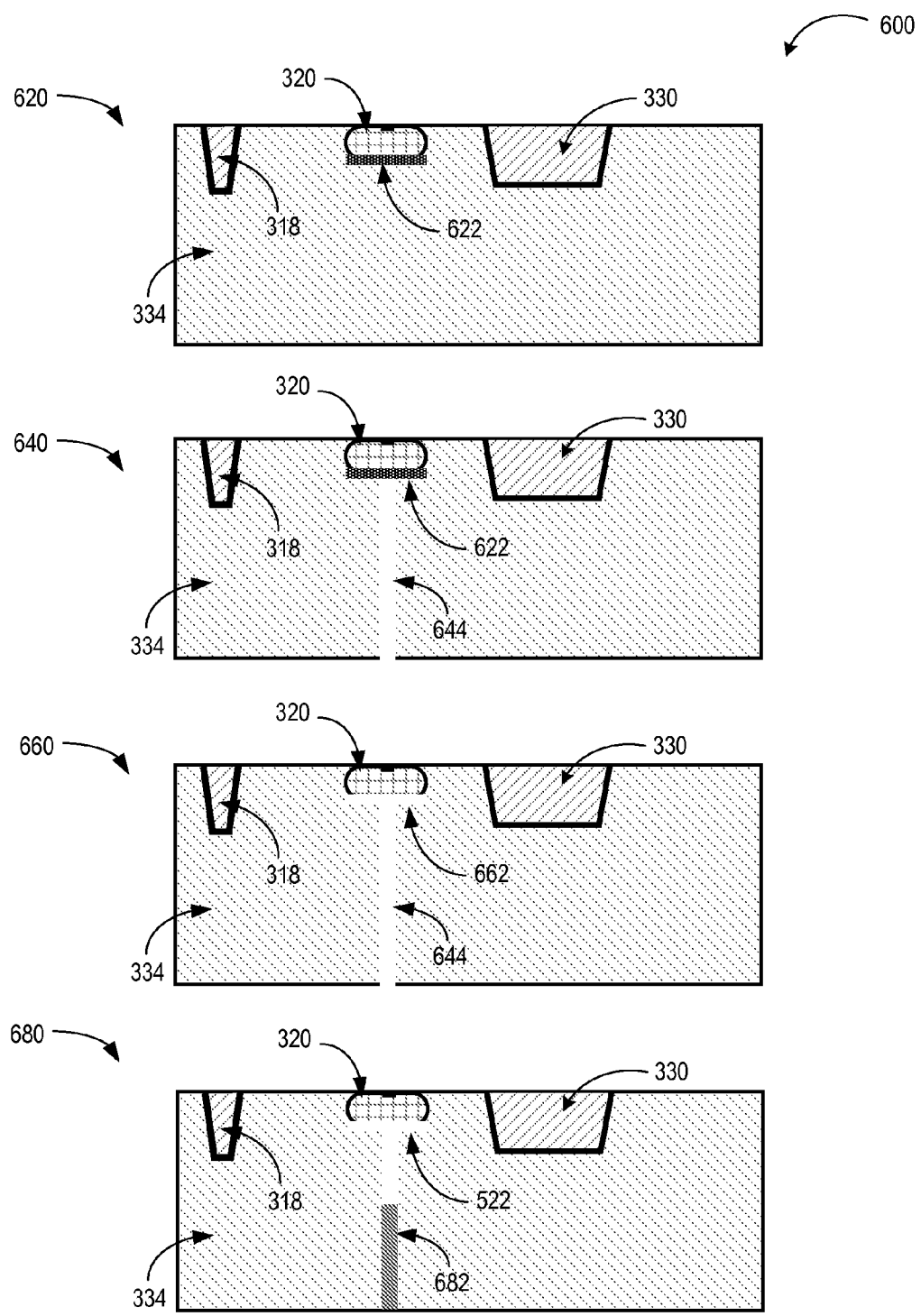
FIG. 6 depicts an example process by which planar area components of a body-drain junction region may be removed in a semiconductor device.

FIG. 6 depicts an example process by which planar area components of a body-drain junction region may be removed in a semiconductor device, arranged in accordance with at least some embodiments described herein.

The process 600 illustrates how T-shaped cavities, such as the T-shaped cavity 526, may be formed by removal of planar area components. A diagram 620 depicts a portion of a transistor (for example, the transistor 500) during fabrication. The depicted transistor portion may include the epitaxial layer 334, the drain trench structures 318 and 330, and the body implant region 320. A buried oxide region 622 may be fabricated in the epitaxial layer 334, for example using a masked oxygen implantation process followed by a thermal annealing process. In some embodiments, the buried oxide region 622 may be fabricated at the beginning of the transistor fabrication process.

Subsequently, near the completion of the transistor fabrication process, the transistor substrate may be thinned, and a narrow trench 644 etched from the backside of the substrate to the buried oxide region 622, as depicted in a diagram 640. In some embodiments, the backside etch process may involve flipping the wafer that includes the transistor and etching the narrow trench 644 using a DRIE process as described above in FIG. 4. The buried oxide region 622 may then be etched away through the narrow trench 644, for example by using hydrofluoric acid in the vapor phase or any other suitable etching process, resulting in a horizontal cavity 662 as depicted in a diagram 660. The narrow trench 644 may then be sealed by the deposition of a dielectric plug 682 applied from the substrate backside, as shown in a diagram 680. In some embodiments, the dielectric plug 682 may be applied using an oxide plasma-enhanced chemical vapor deposition (PECVD) process.

Figure 7:
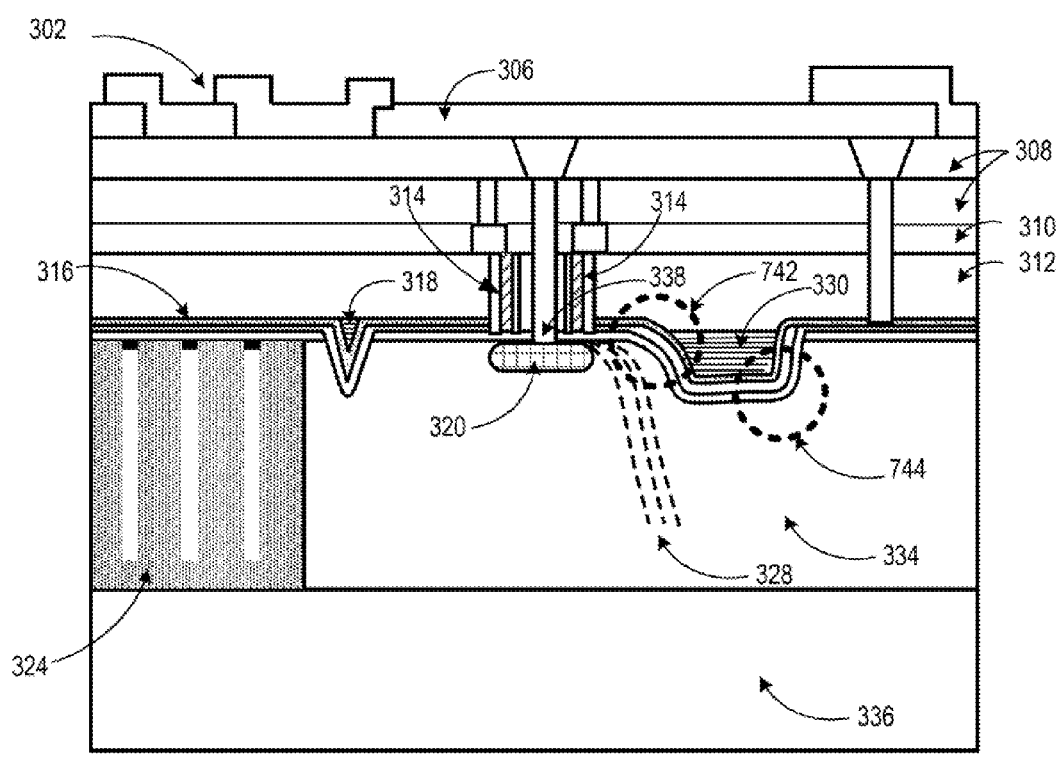
FIG. 7 illustrates a side view of an example transistor with reduced output capacitance through removal of areas in the drain region of the transistor that do not contribute to the current flow, such as sharp corners of the drain trench.

FIG. 7 illustrates a side view of an example transistor with reduced output capacitance through removal of areas in the drain region of the transistor that do not contribute to the current flow, such as sharp corners of the drain well, arranged in accordance with at least some embodiments described herein.

According to FIG. 7, a transistor 700 may be similar to the transistor 300, with similarly-numbered elements having generally similar characteristics. Differently than the transistor 300, the transistor 700 may not have a spherical cavity such as the spherical cavity 326, and may instead have drain trench structures 318 and 330 with rounded or curved corners 742 and 744. As described above, the drain trench structures 318 and 330 and their sidewall shield layers may improve the breakdown characteristics of the transistor 700 by depletion of the drain region. However, the corners of the drain trench structures 318 and 330, if not rounded or curved, may be subject to relatively high electric fields due to high radius of curvature, and may degrade the breakdown characteristics of the transistor 700. In addition, the portions of the epitaxial silicon layer 334 present at some corners of the drain trench structures 318 and 330, for example the corner 742 (if not rounded or curved), may contribute to the output capacitance of the transistor 700 due to the electrical coupling of the sidewall shield layer and the source contact 306.

Accordingly, the corners of the drain trench structures 318 and 330, for example, the corners 742 and 744, may be rounded during fabrication of the transistor 700. The drain trench structures 318 and 330 may be formed by first etching trenches out of the epitaxial silicon layer 334 using, for example, a masked reactive-ion etch (RIE) process or TMAH-based anisotropic etch process. Before filling the trenches with dielectric, the etched trenches may be annealed in a hydrogen atmosphere, which may cause migration of silicon atoms away from high curvature areas (for example, the trench corners corresponding to the corners 742 and 744). The silicon migration may reduce the radius of curvature of the trench corners, rounding them into curved surfaces. As a result, the breakdown characteristics of the transistor 700 may be improved due to the relatively lower electric fields the corners 742 and 744 may be subject to during operation. Moreover, the rounding of the corner 742, which may cause the migration of silicon atoms away from the portion of the epitaxial silicon layer 334 at the corner 742, may also result in reduction of the output capacitance of the transistor 700.

Figure 8:
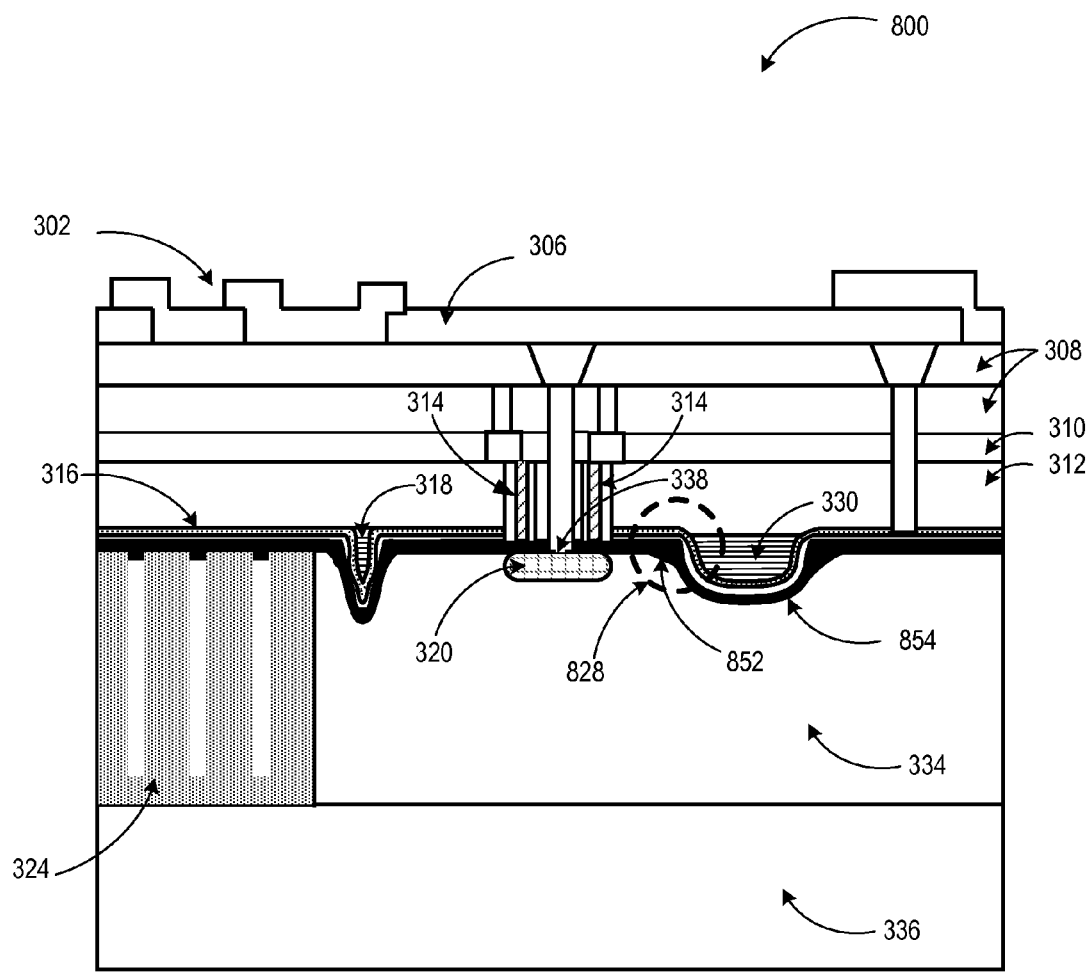
FIG. 8 illustrates a side view of an example transistor with reduced output capacitance through removal of sharp corners of the drain trench by filling the corners with a dielectric.

FIG. 8 illustrates a side view of an example transistor with reduced output capacitance through removal of sharp corners of the drain well by filling the corners with a dielectric, arranged in accordance with at least some embodiments described herein.

According to FIG. 8, a transistor 800 may be similar to the transistor 700, with similarly-numbered elements having generally similar characteristics. In addition to the rounding of the drain trench corner 828 (corresponding to the drain trench corner 742), an oxide plug 852 may be formed on the rounded drain trench corner 828. The oxide plug 852 may provide further separation between the epitaxial silicon substrate 334 and the portion of the planar portion of the shield layer 316, resulting in further reduction in the output capacitance of the transistor 800 as compared to the transistor 700. In some embodiments, oxide plug(s) may not be formed at the rounded drain trench corner 854 (corresponding to the corner 744).

The oxide plug 852 may be formed using any suitable method. In some embodiments, the oxide plug 852 may be formed using a conformal oxide deposition process. As described above, the drain trench structures 318 and 330 may be formed by first etching trenches out of the epitaxial silicon layer 334 using a masked etch process. After the masked etch process is complete, the masking layer may be left on the substrate, and a hydrogen anneal process may be performed as described in FIG. 7 to round the corners of the trenches. In some embodiments, the hydrogen anneal process may cause the corners of the trenches under the edges of the masking layer (for example, the trench corner corresponding to the corner 828) to recede away from the masking layer edge. Subsequently, a conformal oxide deposition process may be used to deposit a layer of conformal oxide to the etched and annealed trenches. The conformal oxide deposition process may cause conformal oxide to be deposited under the masking layer at the corners of the trenches that receded away from the masking layer during the hydrogen anneal process. An oxide etch may then be used to remove exposed conformal oxide, and may leave the oxide deposited under the masking layer at the trench corners intact, forming oxide plugs such as the oxide plug 852.

Figure 9:
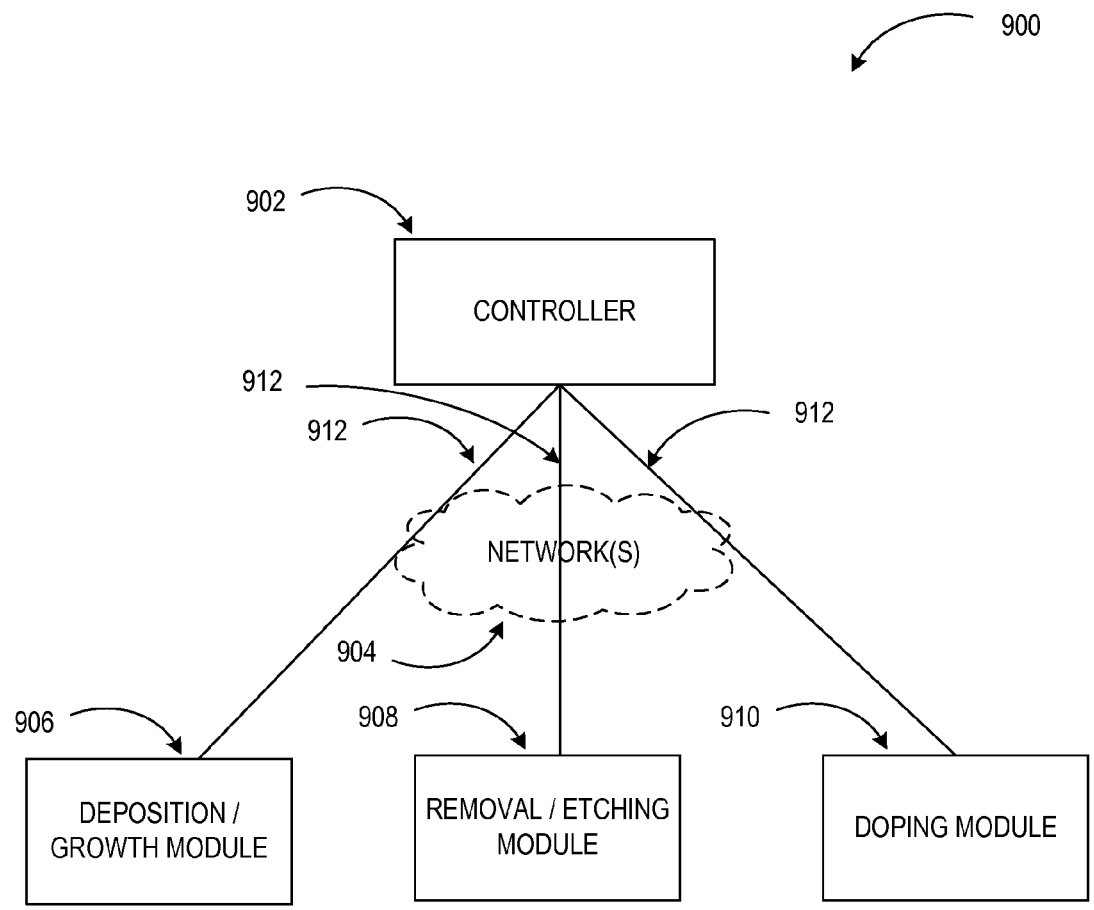
FIG. 9 illustrates an example fabrication system for a transistor with reduced output capacitance.

FIG. 9 illustrates an example fabrication system for a transistor with reduced output capacitance, arranged in accordance with at least some embodiments described herein.

A fabrication system 900 may include a controller 902 that may be communicatively coupled to a deposition/growth module 906, a removal/etching module 908, and a doping module 910 via one or more communication links 912. In some embodiments, the communication links 912 may be routed through one or more networks 904.

In some embodiments, the controller 902 may be configured to direct or cause to be directed the operation of one or more of the deposition/growth module 906, the removal/etching module 908, and the doping module 910. For example, the controller 902 may direct or cause to be directed the modules 906, 908, and 910 to perform one or more fabrication recipes, each of which may include one or more fabrication operations associated with the fabrication of semiconductor devices with reduced output capacitances as described herein.

The deposition/growth module 906 may be configured to perform deposition/growth fabrication operations such as dielectric growth or deposition, metal deposition, polysilicon deposition, and/or the deposition/growth of any material suitable for semiconductor device fabrication. In some embodiments, the deposition/growth module 906 may also be configured to perform thermal processing or annealing of materials. The removal/etching module 908 may be configured to perform material removal/etch fabrication operations such as dielectric removal/etch, metal removal/etch, substrate removal/etch, masking/protective layer removal, substrate planarization, or any other material removal process suitable for device fabrication. In some embodiments, the deposition/growth module 906 and/or the removal/etching module 908 may be configured to perform lithographic operations, such as masking layer deposition/removal, masking layer patterning, masking layer pattern development, or any other suitable lithographic or patterning process for device fabrication.

The doping module 910 may be configured to perform ion implantation operations such as implantation to form source, drain, or other active regions, implantation to form body regions, implantation to form buried oxide layers, or any other suitable doping or ion implantation operations suitable for device fabrication.

Figure 10:
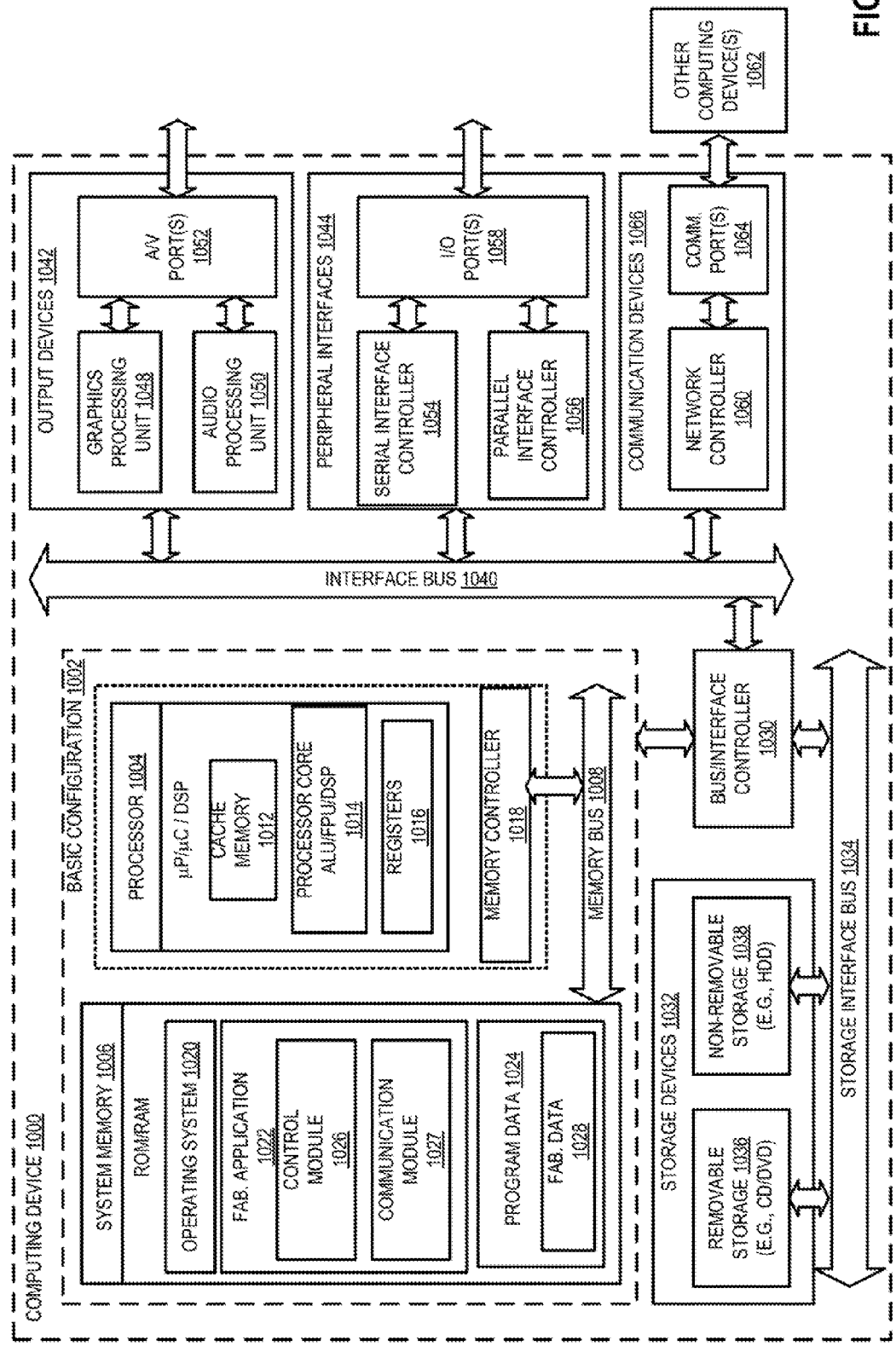
FIG. 10 illustrates an example computing device that may implement or operate as a controller of a fabrication system for a transistor with reduced output capacitance.

FIG. 10 illustrates an example computing device that may implement or operate as a controller of a fabrication system for a transistor with reduced output capacitance, arranged in accordance with at least some embodiments described herein.

For example, a computing device 1000 may be used as a controller (for example, the controller 902) to control fabrication of power transistors as described herein. In an example basic configuration 1002, the computing device 1000 may include one or more processors 1004 and a system memory 1006. A memory bus 1008 may be used to communicate between the processor 1004 and the system memory 1006. The basic configuration 1002 is illustrated in FIG. 10 by those components within the inner dashed line.

Depending on the desired configuration, the processor 1004 may be of any type, including but not limited to a microprocessor (μP), a microcontroller (μC), a digital signal processor (DSP), or any combination thereof. The processor 1004 may include one more levels of caching, such as a cache memory 1012, a processor core 1014, and registers 1016. The example processor core 1014 may include an arithmetic logic unit (ALU), a floating point unit (FPU), a digital signal processing core (DSP Core), or any combination thereof. An example memory controller 1018 may also be used with the processor 1004, or in some implementations the memory controller 1018 may be an internal part of the processor 1004.

Depending on the desired configuration, the system memory 1006 may be of any type including but not limited to volatile memory (such as RAM), non-volatile memory (such as ROM, flash memory, etc.) or any combination thereof. The system memory 1006 may include an operating system 1020, a fabrication application 1022, and program data 1024. The fabrication application 1022 may include a control module 1026 and a communication module 1027 to control and communicate with fabrication modules (for example, the deposition/growth module 906, the removal/etching module 908, and/or the doping module 910) to fabricate transistors as described herein. The program data 1024 may include, among other data, fabrication data 1028 or the like, as described herein.

The computing device 1000 may have additional features or functionality, and additional interfaces to facilitate communications between the basic configuration 1002 and any desired devices and interfaces. For example, a bus/interface controller 1030 may be used to facilitate communications between the basic configuration 1002 and one or more data storage devices 1032 via a storage interface bus 1034. The data storage devices 1032 may be one or more removable storage devices 1036, one or more non-removable storage devices 1038, or a combination thereof. Examples of the removable storage and the non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

The system memory 1006, the removable storage devices 1036 and the non-removable storage devices 1038 are examples of computer storage media. Computer storage media includes, but is not limited to, RAM, ROM, EEPROM, flash memory or other memory technology, CD-ROM, digital versatile disks (DVDs), solid state drives, or other optical storage, magnetic cassettes, magnetic tape, magnetic disk storage or other magnetic storage devices, or any other medium which may be used to store the desired information and which may be accessed by the computing device 1000. Any such computer storage media may be part of the computing device 1000.

The computing device 1000 may also include an interface bus 1040 for facilitating communication from various interface devices (e.g., one or more output devices 1042, one or more peripheral interfaces 1044, and one or more communication devices 1066) to the basic configuration 1002 via the bus/interface controller 1030. Some of the example output devices 1042 include a graphics processing unit 1048 and an audio processing unit 1050, which may be configured to communicate to various external devices such as a display or speakers via one or more A/V ports 1052. One or more example peripheral interfaces 1044 may include a serial interface controller 1054 or a parallel interface controller 1056, which may be configured to communicate with external devices such as input devices (e.g., keyboard, mouse, pen, voice input device, touch input device, etc.) or other peripheral devices (e.g., printer, scanner, etc.) via one or more I/O ports 1058. An example communication device 1066 includes a network controller 1060, which may be arranged to facilitate communications with one or more other computing devices 1062 over a network communication link via one or more communication ports 1064. The one or more other computing devices 1062 may include servers at a datacenter, customer equipment, and comparable devices.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 1000 may be implemented as a part of a general purpose or specialized server, mainframe, or similar computer that includes any of the above functions. The computing device 1000 may also be implemented as a personal computer including both laptop computer and non-laptop computer configurations.

Figure 11:
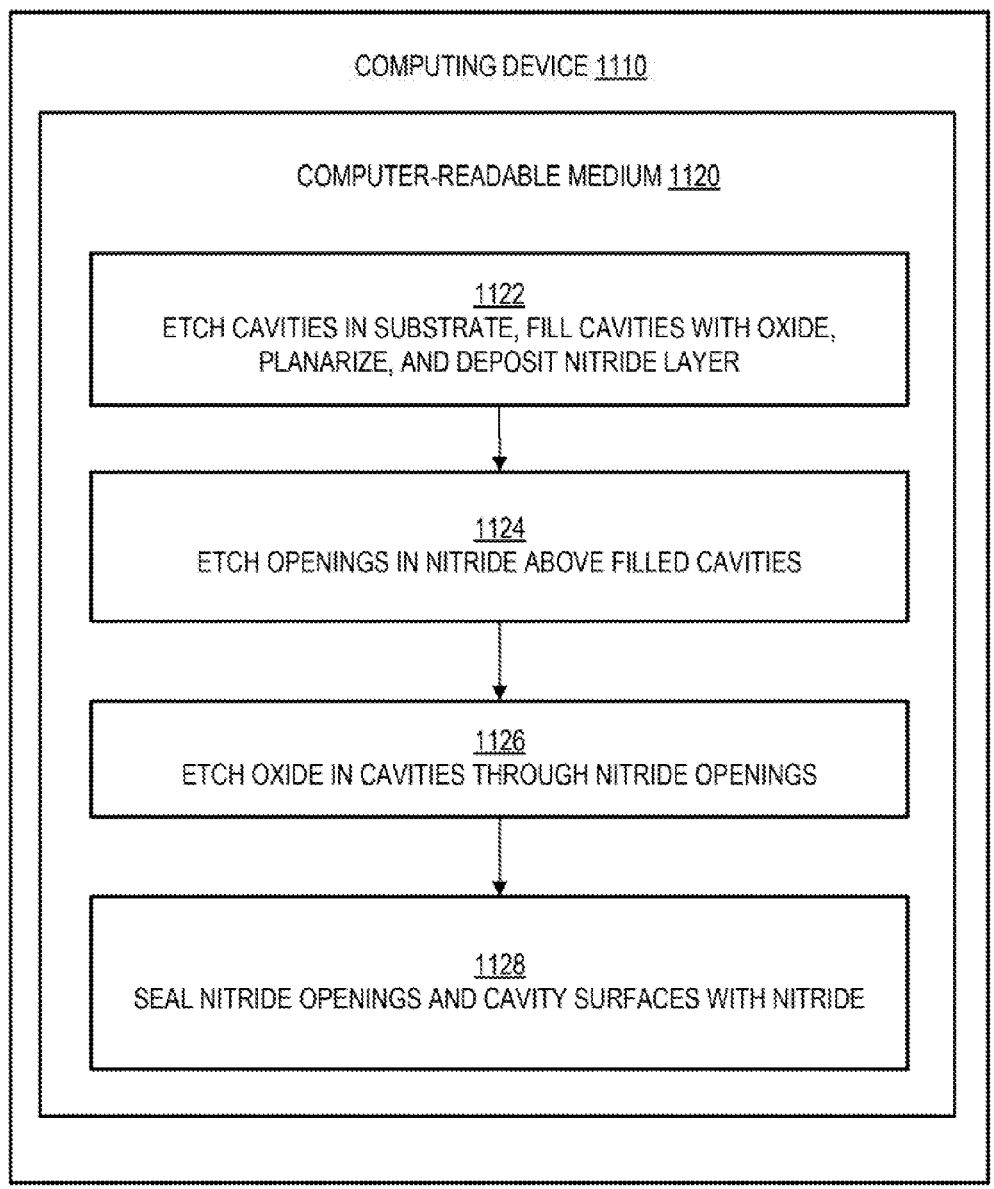
FIG. 11 illustrates a flowchart of a process to fabricate an example transistor with sealed air gaps.

FIG. 11 illustrates a flowchart of a process to fabricate an example transistor with sealed air gaps, arranged in accordance with at least some embodiments described herein.

Example methods may include one or more operations, functions or actions as illustrated by one or more of blocks 1122, 1124, 1126, and/or 1128, and may in some embodiments be performed by a computing device such as the computing device 1110 in FIG. 11. The operations described in the blocks 1122-1128 may also be performed by devices, modules, and/or other components in response to execution, by the computing device 1110, of computer-executable instructions stored on a computer-readable medium, such as a computer-readable medium 1120 of a computing device 1110. Other ways of performing the disclosed method may be performed. For the sake of illustration, the method depicted in FIG. 11 will be described herein in terms of the computing device 1110 (for example implemented as a controller) performing or causing to be performed the depicted operations. In the embodiments of the method shown and described with respect to FIG. 11 and other figures throughout this disclosure, the described operations need not be performed in the precise order shown. Various operations can be added, combined, removed, and/or modified in any suitable order or manner.

An example process to fabricate transistors with sealed air gaps may begin with block 1122, "ETCH CAVITIES IN SUBSTRATE, FILL CAVITIES WITH OXIDE, PLANARIZE, AND DEPOSIT NITRIDE LAYER". In block 1122, a controller (for example, the controller 902) may cause a deposition/growth module (for example, the module 906) and a removal/etching module (for example, the module 908) to first etch one or more cavities in a substrate and then fill the etched cavities with oxide, as described above in FIG. 2. Subsequently, the controller may cause the removal/etching module to planarize the substrate and then cause the deposition/growth module to deposit a nitride layer on the substrate, again as described above in FIG. 2.

Block 1122 may be followed by block 1124, "ETCH OPENINGS IN NITRIDE ABOVE FILLED CAVITIES", where the controller may cause the removal/etching module to etch openings in the deposited nitride layer above the cavities filled in block 1122, as described above in the diagram 220.

Block 1124 may be followed by block 1126, "ETCH OXIDE IN CAVITIES THROUGH NITRIDE OPENINGS", where the controller may cause the removal/etching module to etch the oxide in the cavities through the openings formed in the nitride layer, as described above in the diagram 240.

Block 1126 may be followed by block 1128, "SEAL NITRIDE OPENINGS AND CAVITY SURFACES WITH NITRIDE", where the controller may cause the deposition/growth module to cover the interior surfaces of the cavities with nitride as well as plug the openings formed in the nitride layer with nitride plugs, as described above in the diagram 260.

Figure 12:
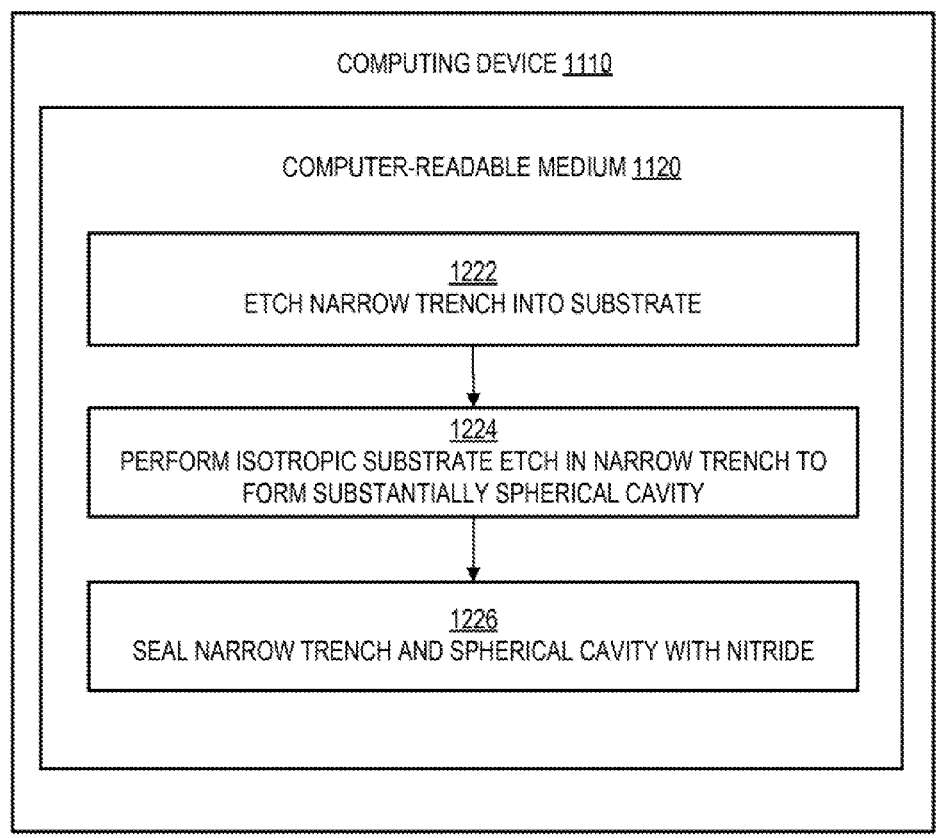
FIG. 12 illustrates a flowchart of a process to fabricate an example transistor with spherical cavities.

FIG. 12 illustrates a flowchart of a process to fabricate an example transistor with spherical cavities, arranged in accordance with at least some embodiments described herein.

Example methods may include one or more operations, functions or actions as illustrated by one or more of blocks 1222, 1224, and/or 1226, and may in some embodiments be performed by a computing device such as the computing device 1100 in FIG. 12. The operations described in the blocks 1222-1226 may also be performed by devices, modules, and/or other components in response to execution, by the computing device 1110, of computer-executable instructions stored on a computer-readable medium, such as a computer-readable medium 1120 of a computing device 1110. Other ways of performing the disclosed method may be performed. For the sake of illustration, the method depicted in FIG. 12 will be described herein in terms of the computing device 1110 (for example implemented as a controller) performing or causing to be performed the depicted operations.

An example process to fabricate transistors with spherical cavities may begin with block 1222, "ETCH NARROW TRENCH INTO SUBSTRATE". In block 1222, a controller (for example, the controller 902) may cause a removal/etching module (for example, the module 908) to etch a narrow trench into a substrate epitaxial layer, as described above in the diagram 420. In some embodiments, the removal/etching module may use a DRIE process to etch the narrow trench, and may etch the narrow trench in approximately the middle of a body implant region, as described above.

Block 1222 may be followed by block 1224, "PERFORM ISOTROPIC SUBSTRATE ETCH IN NARROW TRENCH TO FORM SUBSTANTIALLY SPHERICAL CAVITY", where the controller may cause the removal/etching module to perform an isotropic etch process at the bottom of the narrow trench to form a substantially spherical cavity in the substrate epitaxial layer, as described above in the diagram 440. In some embodiments, the removal/etching module may use an XeF2 etch process that is highly selective for silicon, as described above.

Block 1224 may be followed by block 1226, "SEAL NARROW TRENCH AND SPHERICAL CAVITY WITH NITRIDE", where the controller may cause a deposition/growth module (for example, the module 906) to cover the interior surface of the spherical cavity as well as seal the narrow trench with nitride, as described above in the diagram 460.

Figure 13:
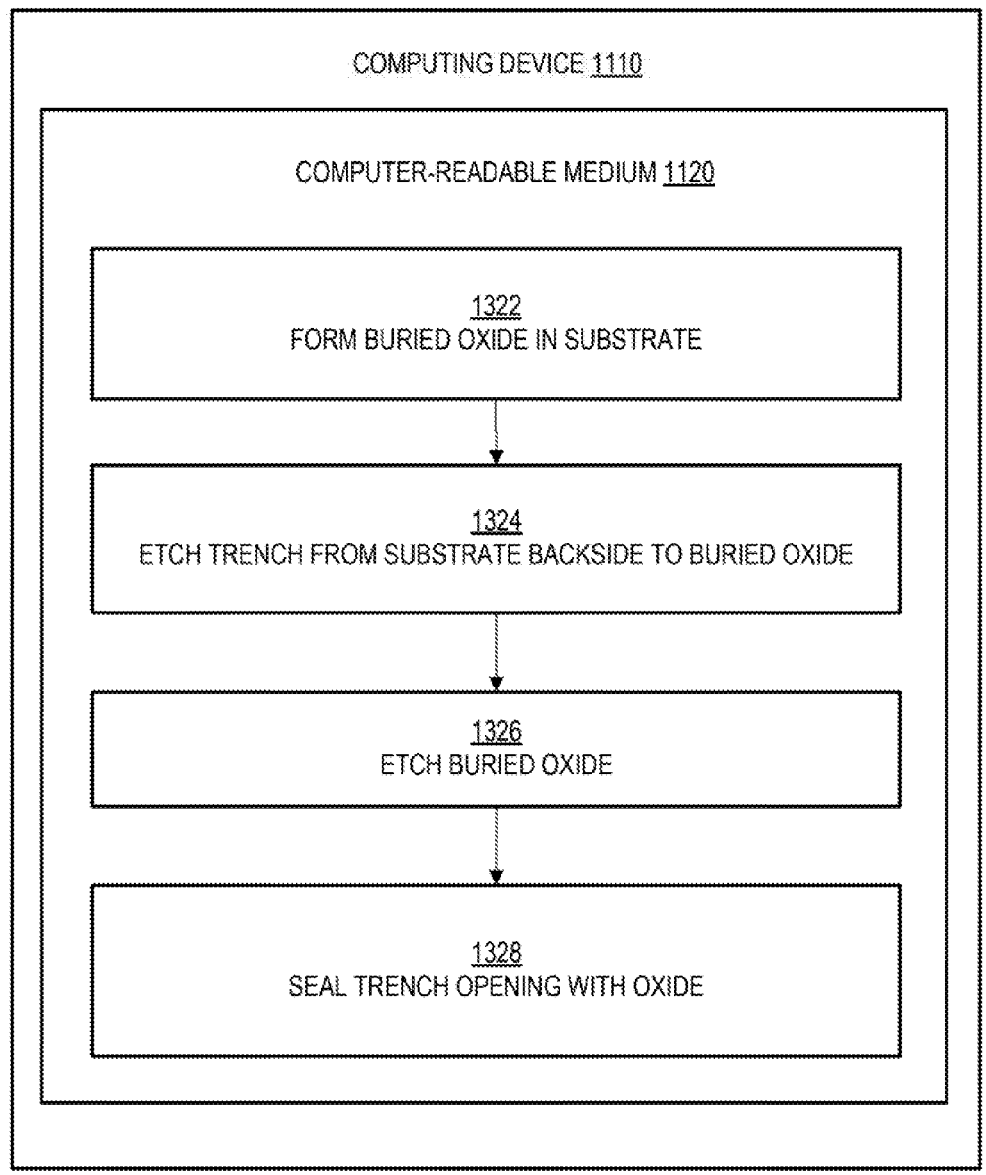
FIG. 13 illustrates a flowchart of a process to fabricate an example transistor through removal of planar area components.

FIG. 13 illustrates a flowchart of a process to fabricate an example transistor through removal of planar area components, arranged in accordance with at least some embodiments described herein.

Example methods may include one or more operations, functions or actions as illustrated by one or more of blocks 1322, 1324, 1326, and/or 1328, and may in some embodiments be performed by a computing device such as the computing device 1110 in FIG. 13. The operations described in the blocks 1322-1328 may also be performed by devices, modules, and/or other components in response to execution, by the computing device 1110, of computer-executable instructions stored on a computer-readable medium, such as a computer-readable medium 1120 of a computing device 1110. Other ways of performing the disclosed method may be performed. For the sake of illustration, the method depicted in FIG. 13 will be described herein in terms of the computing device 1110 (for example implemented as a controller) performing or causing to be performed the depicted operations.

An example process to fabricate transistors through removal of planar area components may begin with block 1322, "FORM BURIED OXIDE IN SUBSTRATE". In block 1322, a controller (for example, the controller 902) may cause a doping module (for example, the module 910) to form a buried oxide layer in a substrate epitaxial layer, as described above in the diagram 620. In some embodiments, the doping module may implant oxygen into the epitaxial layer using, for example, ion bombardment, and may then anneal the epitaxial layer to transform the implanted oxygen into oxide.

Block 1322 may be followed by block 1324, "ETCH TRENCH FROM SUBSTRATE BACKSIDE TO BURIED OXIDE", where the controller may cause a removal/etching module (for example, the module 908) to etch a trench from an exposed backside of the substrate to the buried oxide layer, as described above in the diagram 640. In some embodiments, the removal/etching module may etch the backside trench using a DRIE process as described above. In some embodiments, other device fabrication steps may fall between block 1322 and block 1324. For example, block 1322 may occur near the beginning of the device fabrication process, and block 1324 may occur near the end of the device fabrication process.

Block 1324 may be followed by block 1326, "ETCH BURIED OXIDE", where the controller may cause the removal/etching module to etch the buried oxide layer through the trench etched in block 1324, as described above in the diagram 660. In some embodiments, the removal/etching module may etch the buried oxide layer using a vapor-phase hydrofluoric acid etch process, as described above.

Block 1326 may be followed by block 1328, "SEAL TRENCH OPENING WITH OXIDE", where the controller may cause a deposition/growth module (for example, the module 906) to seal the opening of the backside trench with an oxide, as described above in the diagram 680. In some embodiments, the deposition/growth module may seal the opening using a PECVD process, as described above.

Figure 14:
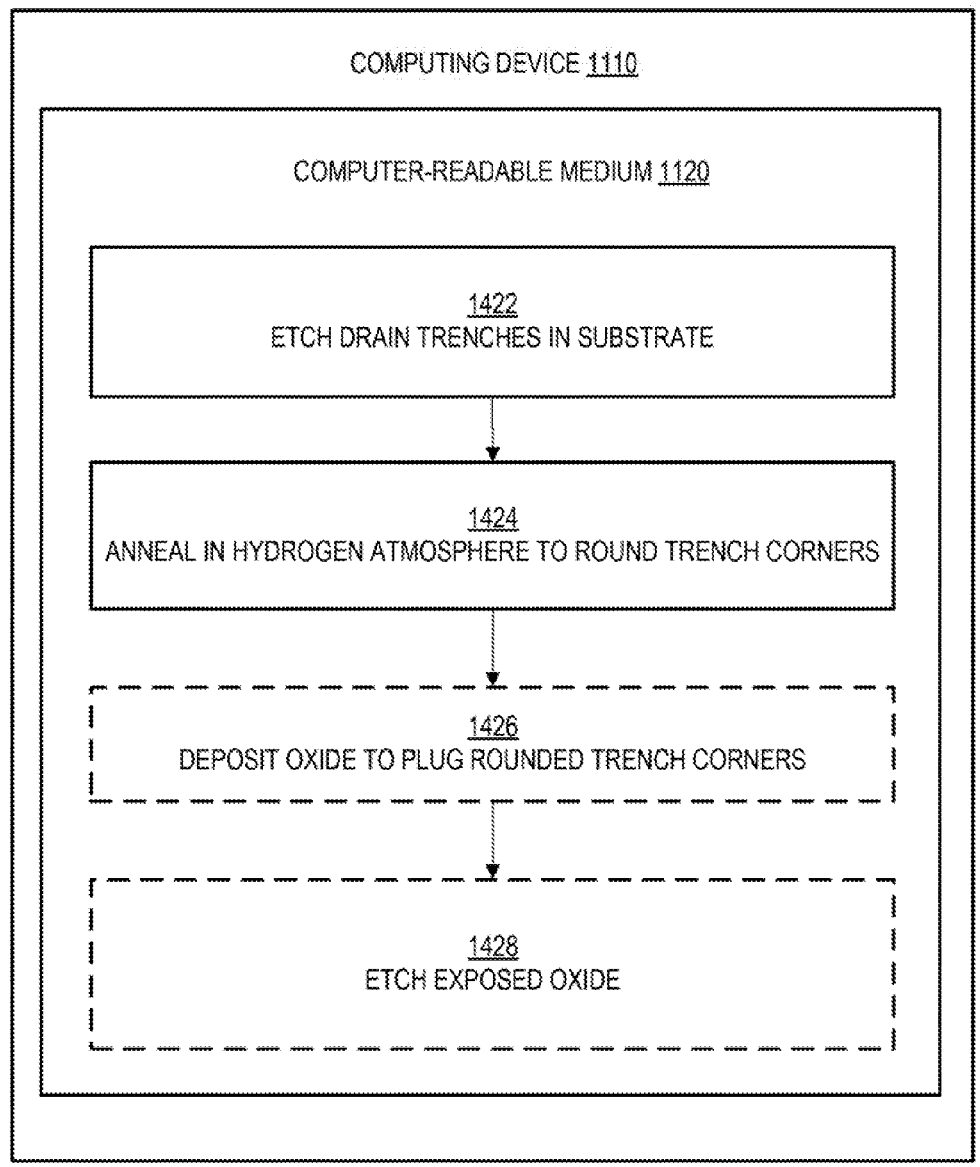
FIG. 14 illustrates a flowchart of a process to fabricate an example transistor with reduced output capacitance, all arranged in accordance with at least some embodiments described herein.

FIG. 14 illustrates a flowchart of a process to fabricate an example transistor with reduced output capacitance, arranged in accordance with at least some embodiments described herein.

Example methods may include one or more operations, functions or actions as illustrated by one or more of blocks 1422, 1424, 1426, and/or 1428, and may in some embodiments be performed by a computing device such as the computing device 1110 in FIG. 14. The operations described in the blocks 1422-1428 may also be performed by devices, modules, and/or other components in response to execution, by the computing device 1110, of computer-executable instructions stored on a computer-readable medium, such as a computer-readable medium 1120 of a computing device 1110. Other ways of performing the disclosed method may be performed. For the sake of illustration, the method depicted in FIG. 14 will be described herein in terms of the computing device 1110 (for example implemented as a controller) performing or causing to be performed the depicted operations.

An example process to fabricate transistors with reduced output capacitance may begin with block 1422, "ETCH DRAIN TRENCHES IN SUBSTRATE", where a controller (for example, the controller 902) may cause a removal/etching module (for example, the module 908) to etch drain trenches in a substrate epitaxial layer, as described above. In some embodiments, the removal/etching module may etch the drain trenches using a masked RIE process or a masked TMAH-based anisotropic etch process.

Block 1422 may be followed by block 1424, "ANNEAL IN HYDROGEN ATMOSPHERE TO ROUND TRENCH CORNERS", where the controller may cause a deposition/growth module (for example, the module 906) to anneal the drain trenches in a hydrogen atmosphere as described above in order to cause trench corner rounding due to silicon atom migration.

In some embodiments, block 1424 may be followed by optional block 1426 (depicted in broken lines), "DEPOSIT OXIDE TO PLUG ROUNDED TRENCH CORNERS", where the controller may cause the deposition/growth module to form an oxide plug at some of the rounded trench corners, as described above. In some embodiments, the deposition/growth module may use a conformal oxide deposition process to form the oxide plug, as described above in FIG. 8.

In embodiments where optional block 1426 is performed, block 1426 may be followed by optional block 1428 (depicted in broken lines), "ETCH EXPOSED OXIDE", where the controller may cause the removal/etching module to etch any oxide that is deposited in optional block 1426 and also exposed. In some embodiments, the oxide plugs at the rounded trench corners may be deposited beneath a pre-existing mask layer used to etch the drain trenches in block 1422, and therefore may not be exposed for removal, as described above.

According to some examples, a semiconductor device is described. An example semiconductor device may include a substrate, an epitaxial layer in contact with a surface of the substrate, a nitride layer in contact with a surface of the epitaxial layer, a body region within a top portion of the epitaxial layer, a source region within the top portion of the epitaxial layer, and a drain region within the epitaxial layer. The source region may be electrically coupled to the body region, and the epitaxial layer may include a cavity region below the nitride layer between the drain region and the body region such that a planar drift distance between the drain region and the source region is increased by two or more dimensions of the cavity region.

According to some embodiments, the semiconductor device may further include an oxide layer in contact with the nitride layer, a dielectric layer in contact with the oxide layer, one or more interlayer dielectric layers in contact with the dielectric layer, and a contact layer. A first portion of the contact layer may be in contact with the source region such that a distance between the drain region and the first portion of the contact layer is increased by a vertical dimension of the cavity region. The semiconductor device may further include another drain region within the epitaxial layer and another cavity region between the nitride layer, where the body region is centrally located within the top portion of the epitaxial layer between the drain region and the another drain region. The contact layer may further include a second portion in contact with the drain region and a third portion in contact with the another drain region, where the first, second, and third portions may be separated by passivation layers.

According to other embodiments, a width of the cavity region may be in a range from about 3 micrometers to about 20 micrometers. A height of the cavity region may be in a range from about 0.5 micrometers to about 5 micrometers. The cavity region may have a substantially trapezoidal shape. The semiconductor device may be a lateral transistor, a lateral power transistor, a lateral radio frequency (RF) power transistor, or a lateral double-diffused metal oxide semiconductor (LDMOS).

According to other examples, a method to fabricate a semiconductor device is described. An example method may include forming an epitaxial region over a substrate, forming two drain regions within the epitaxial layer, forming a body region within a top portion of the epitaxial layer between the two drain regions, and forming a source region within the top portion of the epitaxial layer, where the source region is electrically coupled to the body region. The method may further include forming a nitride layer in contact with a top surface of the epitaxial layer and forming two cavity regions located substantially between the body region and the two drain regions below the nitride layer such that a planar drift distance between the two drain regions and the source region is increased by two or more dimensions of the cavity region.

According to some embodiments, the method may further include forming an oxide layer in contact with the nitride layer, forming a dielectric layer in contact with the oxide layer, forming one or more interlayer dielectric layers in contact with the dielectric layer, and forming a contact layer. The first portion of the contact layer may be in contact with the source region such that a distance between the two drain regions and the first portion of the contact layer is increased by a vertical dimension of the two cavity regions. The method may further include forming two vertical gate terminals on the top surface of the epitaxial layer substantially along at least one outer edge of the body region.

According to further examples, a semiconductor device is described. An example semiconductor device may include a substrate, an epitaxial layer in contact with a top surface of the substrate, a drain layer in the substrate, a body region within a top portion of the epitaxial layer, and a source region within a top portion of the body region. The semiconductor device may further include a vertical gate structure substantially along at least one outer edge of the body region and a substantially spherical cavity region within the epitaxial layer and a bottom portion of the body region. The cavity region may be configured to lower a contribution of the body region to an output capacitance of the semiconductor device with a reduced effect or substantially no effect on a current flow through the body region.

According to some embodiments, the semiconductor device may further include two trenches, filled with a dielectric material and on opposite sides of the body region in the top portion of the epitaxial layer, and a conductive shield layer that substantially covers the top surface of the epitaxial layer and at least one of the trenches. The semiconductor device may further include an oxide layer in contact with the shield layer, a dielectric layer in contact with the oxide layer, one or more interlayer dielectric layers in contact with the dielectric layer, and a contact layer. A first portion of the contact layer may be in contact with the gate structure and a second portion of the contact layer may be in contact with the source region and the shield layer.

According to other embodiments, the cavity region may be sealed with a dielectric material at a top portion. A diameter of the cavity region may be in a range from about 1 micrometer to about 4 micrometers. The semiconductor device may be a vertical transistor, a vertical gate shielded power transistor, a lateral transistor, or a lateral gate shielded power transistor.

According to yet further examples, a method to fabricate a semiconductor device is described. An example method may include forming an epitaxial region on a top surface of a substrate, forming a drain layer in the substrate, forming a body region within a top portion of the epitaxial layer, and forming a vertical gate structure substantially along at least one outer edge of the body region. The method may further include forming a source region within a top portion of the body region and forming a substantially spherical cavity region within the epitaxial layer and a bottom portion of the body region. The cavity region may be configured to lower a contribution of the body region to an output capacitance of the semiconductor device with a reduced effect on a current flow through the body region.

According to some embodiments, the method may further include forming two trenches on opposite sides of the body region in the top portion of the epitaxial layer, filling the trenches with a dielectric material, and forming a conductive shield layer that substantially covers the top surface of the epitaxial layer and at least one of the trenches. The method may further include forming an oxide layer in contact with the shield layer, forming a dielectric layer in contact with the oxide layer, forming one or more interlayer dielectric layers in contact with the dielectric layer, and forming a contact layer. A first portion of the contact layer may be in contact with the gate structure and a second portion of the contact layer may be in contact with the source region and the shield layer.

According to other embodiments, forming the cavity region may include removing a central portion of the body region and the source region to form a narrow trench and removing a bottom portion of the body region and the portion of the epitaxial layer below the body region through the narrow trench. Removing the central portion of the body region and the source region may include etching the central portion of the body region and the source region using XeF2 etching. Removing the bottom portion of the body region and the portion of the epitaxial layer below the body region may include etching the bottom portion of the body region and the portion of the epitaxial layer using XeF2 etching. The method may further include sealing a top portion of the spherical cavity region with a dielectric material and/or sealing an internal surface of the spherical cavity region with an oxide material.

According to some examples, a semiconductor device is described. An example semiconductor device may include a substrate, an epitaxial layer in contact with a top surface of the substrate, a drain layer in the substrate, a body region within a top portion of the epitaxial layer, and a source region within a top portion of the body region. The semiconductor device may further include a vertical gate structure substantially along at least one outer edge of the body region and a substantially T-shaped cavity region within the epitaxial layer and a bottom portion of the body region. The cavity region may be configured to lower a contribution of the body region to an output capacitance of the semiconductor device with a reduced effect on a current flow through the body region.

According to some embodiments, the semiconductor device may further include two trenches filled with a dielectric material and on opposite sides of the body region in the top portion of the epitaxial layer, a conductive shield layer that substantially covers a top surface of the epitaxial layer and at least one of the trenches, and an oxide layer in contact with the shield layer. The semiconductor device may further include a dielectric layer in contact with the oxide layer, one or more interlayer dielectric layers in contact with the dielectric layer, and a contact layer. A first portion of the contact layer may be in contact with the gate structure and a second portion of the contact layer may be in contact with the source region and the shield layer.

According to other embodiments, a width of a top portion of the cavity region may be substantially equal to a width of the body region. A width of the top portion of the cavity region may be in a range from about 1 micrometers to about 10 micrometers. A length of a bottom portion of the cavity may be in a range from about 1 micrometers to about 200 micrometers. A width of a bottom portion of the cavity may be in a range from about 1 micrometers to about 10 micrometers.

According to other examples, a method to fabricate a semiconductor device is described. An example method may include forming an epitaxial region on a top surface of a substrate, forming a drain layer in the substrate, forming a body region within a top portion of the epitaxial layer, and forming a vertical gate structure substantially along at least one outer edge of the body region. The method may further include forming a source region within a top portion of the body region and forming a substantially T-shaped cavity region within the epitaxial layer and a bottom portion of the body region. The cavity region may be configured to lower a contribution of the body region to an output capacitance of the semiconductor device with a reduced effect on a current flow through the body region.

According to some embodiments, forming the cavity region may include forming a narrow trench through the epitaxial layer and the substrate, where the narrow trench contacts a bottom surface of the oxide region, removing the oxide region through the narrow trench, and sealing a portion of the narrow trench through the epitaxial layer and the substrate with a dielectric material. Forming the cavity region may further include employing backside processing through flipping a wafer that includes the semiconductor device.

According to other embodiments, the method may further include forming two trenches on opposite sides of the body region in the top portion of the epitaxial layer, filling the trenches with a dielectric material, and forming a conductive shield layer that substantially covers the top surface of the epitaxial layer and at least one of the trenches. The method may further include forming an oxide layer in contact with the shield layer, forming a dielectric layer in contact with the oxide layer, forming one or more interlayer dielectric layers in contact with the dielectric layer, and forming a contact layer. A first portion of the contact layer may be in contact with the gate structure and a second portion of the contact layer may be in contact with the source region and the shield layer. The method may further include sealing an internal surface of the cavity region with an oxide material.

According to further examples, a semiconductor device is described. An example semiconductor device may include a substrate, an epitaxial layer in contact with a top surface of the substrate, a drain layer in the substrate, a body region within a top portion of the epitaxial layer, and a source region within a top portion of the body region. The semiconductor device may further include a vertical gate structure substantially along at least one outer edge of the body region and two trenches on opposite sides of the body region in the top portion of the epitaxial layer. The trenches may be filled with a dielectric material, and corners of at least one of the two trenches may be rounded to lower a contribution of the body region to an output capacitance of the semiconductor device with a reduced effect on a current flow through the body region.

According to some embodiments, the semiconductor device may further include a conductive shield layer that substantially cover the top surface of the epitaxial layer and at least one of the trenches, an oxide layer in contact with the shield layer, a dielectric layer in contact with the oxide layer, one or more dielectric layers in contact with the dielectric layer, and a contact layer. A first portion of the contact layer may be in contact with the gate structure and a second portion of the contact layer may be in contact with the source region and the shield layer. The corners of the at least one of the two trenches may be rounded through removal of a portion of the epitaxial layer around the corners and/or through deposition of an oxide material to a portion of the epitaxial layer outside the corners.

According to yet further examples, a method to fabricate a semiconductor device is described. An example method may include forming an epitaxial region on a top surface of a substrate, forming a drain layer in the substrate, forming a body region within a top portion of the epitaxial layer, and forming a vertical gate structure substantially along at least one outer edge of the body region. The method may further include forming a source region within a top portion of the body region and forming two trenches on opposite sides of the body region in the top portion of the epitaxial layer. The method may further include filling the trenches with a dielectric material and rounding corners of at least one of the two trenches to lower a contribution of the body region to an output capacitance of the semiconductor device with a reduced effect on a current flow through the body region.

According to some embodiments, the method may further include forming a conductive shield layer that substantially covers the top surface of the epitaxial layer and at least one of the trenches, forming an oxide layer in contact with the shield layer, and forming a dielectric layer in contact with the oxide layer. The method may further include forming one or more interlayer dielectric layers in contact with the dielectric layer and forming a contact layer. A first portion of the contact layer may be in contact with the gate structures and a second portion of the contact layer may be in contact with the source region and the shield layer. Rounding the corners may include removing a portion of the epitaxial layer around the corners and/or depositing an oxide material to a portion of the epitaxial layer outside the corners.

Various embodiments may be implemented in hardware, software, or combination of both hardware and software (or other computer-readable instructions stored on a non-transitory computer-readable storage medium and executable by one or more processors); the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via application specific integrated circuits (ASICs), field programmable gate arrays (FPGAs), digital signal processors (DSPs), or other integrated formats. However, some aspects of the embodiments disclosed herein, in whole or in part, may be equivalently implemented in integrated circuits, as one or more computer programs executing on one or more computers (e.g., as one or more programs executing on one or more computer systems), as one or more programs executing on one or more processors (e.g., as one or more programs executing on one or more microprocessors), as firmware, or as virtually any combination thereof, and designing the circuitry and/or writing the code for the software and/or firmware are possible in light of this disclosure.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. Also, the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a compact disc (CD), a digital versatile disk (DVD), a digital tape, a computer memory, a solid state drive, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. A data processing system may include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., control motors to move and/or adjust components and/or quantities).

A data processing system may be implemented utilizing any suitable commercially available components, such as those found in data computing/communication and/or network computing/communication systems. The herein described subject matter sometimes illustrates different components contained within, or connected with, different other components. Such depicted architectures are merely exemplary, and in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but not limited to," etc.). If a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g.,"a system having at least one of A, B, and C" would include but not be limited to systems that have A alone, B alone, C alone, A and B together, A and C together, B and C together, and/or A, B, and C together, etc.). Virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A semiconductor device, comprising:
    a substrate;
    an epitaxial layer in contact with a top surface of the substrate;
    a drain layer in the substrate;
    a body region within a top portion of the epitaxial layer;

a source region within a top portion of the body region;
a vertical gate structure substantially along at least one outer edge of the body region;
two trenches on opposite sides of the body region in the top portion of the epitaxial layer, the trenches filled with a dielectric material, wherein corners of at least one of the two trenches are rounded to lower a contribution of the body region to an output capacitance of the semiconductor device with a reduced effect on a current flow through the body region;
a conductive shield layer that substantially covers a top surface of the epitaxial layer and at least one of the two trenches;
an oxide layer in contact the conductive shield layer;
a dielectric layer in contact with the oxide layer;
one or more interlayer dielectric layers in contact with the dielectric layer; and
a contact layer, wherein a first portion of the contact layer is in contact with the vertical gate structure and a second onion of the contact layer is in contact with the source region and the shield layer.

2. The semiconductor device of claim 1, wherein the corners of the at least one of the two trenches are rounded through removal of a portion of the epitaxial layer around the corners.

3. The semiconductor device of claim 1, wherein the corners of the at least one of the two trenches are rounded through deposition of an oxide material to a portion of the epitaxial layer outside the corners.

4. A semiconductor device, comprising:
a substrate;
an epitaxial layer in contact with a top surface of the substrate;
a drain layer in the substrate;
a body region within a top portion of the epitaxial layer;
a source region within a top portion of the body region;
a vertical gate structure substantially along at least one outer edge of the body region;
two trenches on opposite sides of the body region in the top portion of the epitaxial layer, the trenches filled with a dielectric material, wherein corners of at least one of the two trenches are curved through removal of a portion of the epitaxial layer around the corners so as to lower a contribution of the body region to an output capacitance of the semiconductor device with a reduced effect on a current flow through the body region;
a conductive shield layer that substantially covers a top surface of the epitaxial layer and at least one of the two trenches;
an oxide layer in contact with the conductive shield layer;
a dielectric layer in contact with the oxide layer; and
a contact layer, wherein a first portion of the contact layer is in contact with the vertical gate structure and a second portion of the contact layer is in contact with the source region and the shield layer.

5. The semiconductor device of claim 4, wherein a width of at least one of the two trenches is in a range from about 0.25 micrometers to about 0.5 micrometers.

6. The semiconductor device of claim 4, wherein a depth of at least one of the two trenches is in a range from about 2 micrometers to about 8 micrometers.

7. The semiconductor device of claim 4, wherein the semiconductor device comprises one of a lateral transistor, a lateral power transistor, a lateral radio frequency (RF) power transistor, or a lateral double-diffused metal oxide semiconductor (LDMOS).

8. A semiconductor device, comprising:
a substrate;
an epitaxial layer in contact with a top surface of the substrate;
a drain layer in the substrate;
a body region within a top portion of the epitaxial layer;
a source region within a top portion of the body region and electrically coupled to the body region;
a vertical gate structure substantially along at least one outer edge of the body region;
two trenches on opposite sides of the body region in the top portion of the epitaxial layer, the trenches filled with a dielectric material, wherein corners of at least one of the two trenches are curved through deposition of an oxide material to a portion of the epitaxial layer outside the corners so as to lower a contribution of the body region to an output capacitance of the semiconductor device with a reduced effect on a current flow through the body region;
a conductive shield layer that substantially covers a top surface of the epitaxial layer and at least one of the two trenches;
an oxide layer in contact with the conductive shield layer;
a dielectric layer in contact with the oxide layer;
one or more interlayer dielectric layers in contact with the dielectric layer; and
a contact layer, wherein a first portion of the contact layer is in contact with the vertical gate structure and a second portion of the contact layer is in contact with the source region and the shield layer.

9. The semiconductor device of claim 8, further comprising a Rate contact configured to be electrically coupled to the vertical gate structure.

10. The semiconductor device of claim 9, wherein the vertical gate structure includes at least two gate terminals disposed on the top portion of the epitaxial layer and is configured to control the current flow through the body region.

11. The semiconductor device of claim 8, wherein at least one of the two trenches is formed by at least one of: a masked reactive-ion etch (RIE) process or TMAH-based anisotropic etch process.

12. The semiconductor device of claim 8, wherein the semiconductor device comprises one of: a vertical transistor, a lateral transistor, a vertical gate shielded power transistor, or a lateral gate shielded power transistor.

13. The semiconductor device of claim 4, further comprising one or more interlayer dielectric layers in contact with the dielectric layer.

* * * * *